US009698161B2

(12) United States Patent
Yu et al.

(10) Patent No.: US 9,698,161 B2
(45) Date of Patent: Jul. 4, 2017

(54) DISPLAY DEVICE

(71) Applicant: Samsung Display Co., Ltd., Yongin, Gyeonggi-Do (KR)

(72) Inventors: Seung Jun Yu, Suwon-si (KR); Ha Won Yu, Suwon-si (KR); Ki Kyung Youk, Bucheon-si (KR); O Sung Seo, Seoul (KR); Su Wan Woo, Osan-si (KR); Sang-Myoung Lee, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 101 days.

(21) Appl. No.: 14/710,411

(22) Filed: May 12, 2015

(65) Prior Publication Data

US 2016/0202581 A1    Jul. 14, 2016

(30) Foreign Application Priority Data

Jan. 9, 2015  (KR) ........................ 10-2015-0003667

(51) Int. Cl.
*G02F 1/1343*  (2006.01)
*H01L 27/12*  (2006.01)
*G02F 1/1362*  (2006.01)

(52) U.S. Cl.
CPC ...... *H01L 27/1218* (2013.01); *G02F 1/13624* (2013.01); *G02F 1/134309* (2013.01); *H01L 27/124* (2013.01); *H01L 27/1248* (2013.01); *G02F 2001/134345* (2013.01)

(58) Field of Classification Search
CPC ........... G02F 1/134309; G02F 1/13624; H01L 27/1218; H01L 27/124; H01L 27/1248
See application file for complete search history.

(56) References Cited

U.S. PATENT DOCUMENTS

| 2009/0161048 | A1* | 6/2009 | Satake | G02F 1/133305 349/110 |
| 2014/0204326 | A1* | 7/2014 | Wu | G02F 1/133707 349/143 |
| 2015/0362796 | A1* | 12/2015 | Kong | G02F 1/136286 349/106 |
| 2016/0041443 | A1* | 2/2016 | Wu | G02F 1/136286 349/43 |

FOREIGN PATENT DOCUMENTS

KR  10-2009-0021938  3/2009
KR  10-2013-0125638  11/2013

* cited by examiner

*Primary Examiner* — James Dudek
(74) *Attorney, Agent, or Firm* — Innovation Counsel LLP

(57) ABSTRACT

A display device may include these elements: a first data line; a second data line; a first subpixel electrode positioned at a first half of the display device, connected to the first data line, and comprising a first member and a second member, the first member extending parallel to the first data line, the second member connecting directly to and extending perpendicular to the first member; and a second subpixel electrode positioned at a second half of the display device, connected to the second data line, and comprising a third member and a fourth member, the third member extending parallel to the second data line, the fourth member connecting directly to and extending perpendicular to the third member, wherein the second member and the fourth member are aligned and are positioned between the first member and the third member in a layout view of the display device.

15 Claims, 14 Drawing Sheets

FIG. 12
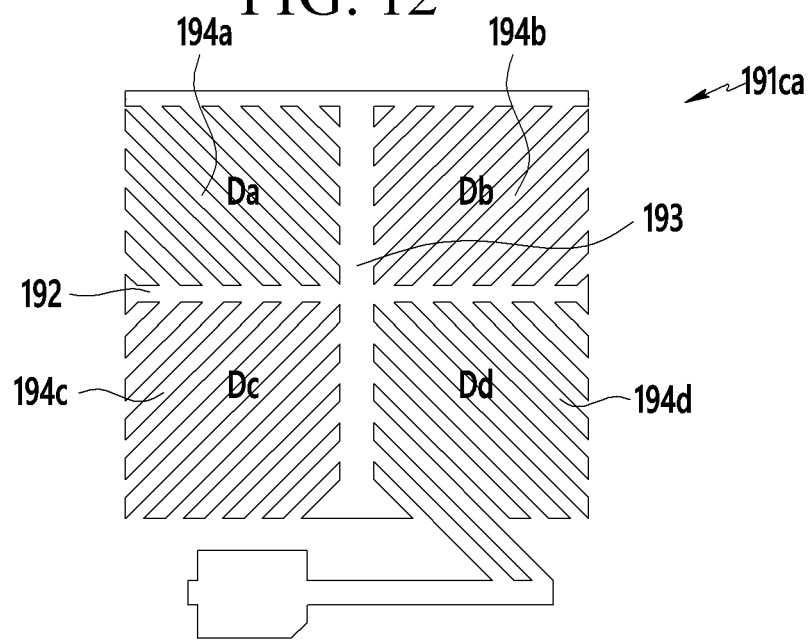
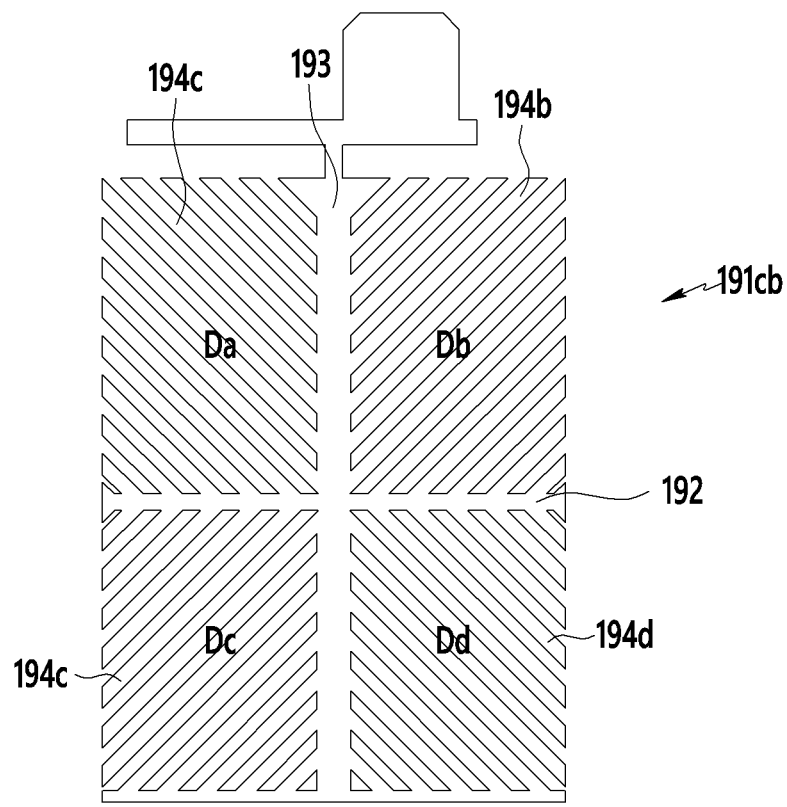

DISPLAY DEVICE

CROSS-REFERENCE TO RELATED APPLICATION

This application claims priority to and the benefit of Korean Patent Application No. 10-2015-0003667 filed in the Korean Intellectual Property Office on Jan. 9, 2015; the entire contents of the Korean Patent Application are incorporated herein by reference.

BACKGROUND (a) Technical Field

The present invention relates to display device, such as a liquid crystal display device.

(b) Description of the Related Art

A display device, such as a liquid crystal display (LCD) device, may include two substrates with field generating electrodes (such as a pixel electrode and a common electrode) and may include a light-regulating layer (such as a liquid crystal layer) interposed between the two substrates. In an LCD device, one or more voltages may be applied to one or more field generating electrodes to generate an electric field in a liquid crystal layer, such that orientations of liquid crystal molecules of the liquid crystal layer may be determined to control light transmission through the liquid crystal layer; therefore, the LCD device may display an image.

A curved display device may have a curve configuration for enhancing viewer experience. The curved display device may have two curved substrates with field-generating electrodes and may have a curved light-regulating layer positioned between the two curved substrates. Misalignment directions of the two curved substrates (or misalignment directions of field-generating electrodes) at a first half of the curved display device may be substantially different from misalignment directions of the curved substrates (or misalignment directions of field-generating electrodes) at a second half of the curved display device. As a result, quality of images displayed by the curved display device may be unsatisfactory.

The above information disclosed in this Background section is for enhancement of understanding of the background of the invention. The background section may contain information that does not form the prior art that is already known in this country to a person of ordinary skill in the art.

SUMMARY

Embodiments of the present invention may be related to a liquid crystal display device that may display images with satisfactory quality.

Embodiments of the present invention may be related to a curved liquid crystal display device that may be associated with substantially low degradation of luminance caused by misalignment of lower and upper substrates of the curved display device.

An embodiment of the present invention may be related to a display device, such as a liquid crystal display device. The display device may include a first data line, which may be configured to transmit a first data voltage. The display device may further include a first transistor, which may be electrically connected to the first data line. The display device may further include a second data line, which may be configured to transmit a second data voltage and may extend parallel to the first data line. The display device may further include a second transistor, which may be electrically connected to the second data line. The display device may further include a first subpixel electrode, which may be positioned at a first half (e.g., left half) of the display device, may be electrically connected to the first transistor, may be configured to receive the first data voltage through the first transistor, and may include a first member and a second member. The first member may extend parallel to the first data line. The second member may be directly connected to the first member and may extend perpendicular to the first member in a layout view of the display device. The display device may further include a second subpixel electrode, which may be positioned at a second half of the display device, may be electrically connected to the second transistor, may be configured to receive the second data voltage through the second transistor, and may include a third member and a fourth member. The third member may extend parallel to the second data line. The fourth member may be directly connected to the third member and may extend perpendicular to the third member in the layout view of the display device. The second member and the fourth member may be aligned in a direction perpendicular to the first data line and may be positioned between the first member and the third member in the layout view of the display device.

A distance between a center of the display device and a structure of the first subpixel electrode may be equal to a distance between the center of the display device and a structure of the second subpixel electrode. The structure of the first subpixel may be a mirror image of the structure of the second subpixel electrode in the layout view of display device.

The display device may include a gate line, which may be electrically connected to the first transistor and may be formed of a conductive material. The display device may further include a first storage electrode line, which may be formed of the conductive material, may overlap the first subpixel electrode, and may include a first part and a second part. The first part may extend parallel to the first data line. The second part may be directly connected to the first part and may extend perpendicular to the first part. The display device may further include a second storage electrode line, which may be formed of the conductive material, may overlap the second subpixel electrode, and may include a third part and a fourth part. The third part may extend parallel to the second data line. The fourth part may be directly connected to the third part and may extend perpendicular to the third part. The second part and the fourth part may be positioned between the first part and the third part in the direction perpendicular to the first data line in the layout view of the display device.

A distance between the center of the display device and a structure of the first storage electrode line may be equal to a distance between the center of the display device and a structure of the second storage electrode line. The structure of the first storage electrode line may be a mirror image of the structure of the second storage electrode line in the layout view of the display device.

The display device may include an insulating layer, which may directly contact the first data line. The display device may further include a first reference voltage line, which may directly contact the insulating layer, may overlap the first subpixel electrode, and may include a first portion and a second portion. The first portion may extend parallel to the first data line. The second portion may be directly connected to the first portion and may extend perpendicular to the first portion. The display device may further include a second reference voltage line, which may directly contact the insulating layer, may overlap the second subpixel electrode, and may include a third portion and a fourth portion. The third portion may extend parallel to the second data line. The fourth portion may be directly connected to the third portion and may extend perpendicular to the third portion. The second portion and the fourth portion may be positioned between the first portion and the third portion in the direction perpendicular to the first data line in the layout view of the display device.

A distance between the center of the display device and a structure of the first reference voltage line may be equal to a distance between the center of the display device and a structure of the second reference voltage line. The structure of the first reference voltage line may be a mirror image of the structure of the second reference voltage line in the layout view of the display device. The first portion may overlap the first member.

The display device may include a third subpixel electrode, which may be positioned between the first subpixel electrode and the second subpixel electrode in the layout view of the display device and may include a first stem, a second stem, and a third stem. The first stem may be positioned between the second stem and the third stem in the layout view of the display device. The first stem may extend parallel to the first data line. Each of the second stem and the third stem may be directly connected to the first stem and may extend perpendicular to the first stem. The second stem may be positioned between the second member and the first stem in the layout view of the display device. The third stem may be positioned between the fourth member and the first stem in the layout view of the display device. The display device may further include an insulating layer, which may directly contact the first data line. The display device may further include a reference voltage line, which may directly contact the insulating layer. A portion of the reference voltage line may extend parallel to the first data line and may overlap the first stem.

The display device may include a third transistor. The display device further may include a fourth transistor. The display device may further include a third subpixel electrode, which may be electrically connected to the third transistor and may include a fifth member and a sixth member. The fifth member may extend parallel to the first data line and may be aligned with the first member in a direction parallel to the first data line. The sixth member may be directly connected to the fifth member and may extend perpendicular to the fifth member in a layout view of the display device. The display device may further include a fourth subpixel electrode, which may be electrically connected to the fourth transistor and may include a seventh member and an eighth member. The seventh member may extend parallel to the second data line portion and may be aligned with the third member in a direction parallel to the second data line. The eighth member may be directly connected to the seventh member and may extend perpendicular to the seventh member in the layout view of the display device. The sixth member and the eighth member may be positioned between the fifth member and the seventh member in the layout view of the display device, wherein both the first transistor and the third transistor may be electrically connected to a first gate line, and wherein both the second transistor and the fourth transistor may be electrically connected to the first gate line or a second gate line.

The display device may include a third transistor. The display device may further include a fourth transistor. The display device may further include a third subpixel electrode, which may be electrically connected to the third transistor and may be aligned with the first subpixel electrode in a direction parallel to the first data line. The display device may further include a fourth subpixel electrode, which may be electrically connected to the fourth transistor and may be aligned with the second subpixel electrode in a direction parallel to the second data line. A distance between a center of the display device and a structure of the third subpixel electrode may be equal to a distance between the center of the display device and a structure of the fourth subpixel electrode. The structure of the third subpixel may be a mirror image of the structure of the fourth subpixel electrode in the layout view of the display device, wherein both the first transistor and the third transistor may be electrically connected to a first gate line, and wherein both the second transistor and the fourth transistor may be electrically connected to the first gate line or a second gate line.

The display device may include a third transistor. The display device may further include a fourth transistor. The display device may further include a third subpixel electrode, which may be electrically connected to the third transistor and may be aligned with the first subpixel electrode in a direction parallel to the first data line. The display device may further include a fourth subpixel electrode, which may be electrically connected to the fourth transistor and may be aligned with the second subpixel electrode in a direction parallel to the second data line. A distance between a center of the display device and a structure of the third subpixel electrode may be equal to a distance between the center of the display device and a structure of the fourth subpixel electrode. The structure of the third subpixel may be identical to the structure of the fourth subpixel electrode in the layout view of the display device, wherein both the first transistor and the third transistor may be electrically connected to a first gate line, and wherein both the second transistor and the fourth transistor may be electrically connected to the first gate line or a second gate line. The third subpixel electrode may include a fifth member and a sixth member. The fifth member may extend parallel to the first data line and may be aligned with the first member in a direction parallel to the first data line. The sixth member may be directly connected to the fifth member and may extend perpendicular to the fifth member. The fifth member may be shorter than the first member. The sixth member may be as long as the second member.

The first subpixel electrode may include a stem member, a first branch, and a second branch. The stem member may extend parallel to the first data line, may be spaced from the first member, and may be aligned with the first member may be a direction parallel to the first data line. The first branch may be directly connected to the first member and may be slanted with respect to the first member. The second branch may be directly connected to both the first branch and the stem member and may be slanted with respect to the stem member.

The display device may include a curved display panel. The curved display panel may include the first subpixel electrode and the second subpixel electrode.

An embodiment of the present invention may be related to a display device, such as a curve liquid crystal display device. The display device may include a first data line, which may be configured to transmit a first data voltage. The display device may further include a first transistor, which may be electrically connected to the first data line. The display device may further include a second data line, which may be configured to transmit a second data voltage and may extend parallel to the first data line. The display device may further include a second transistor, which may be electrically connected to the second data line. The display device may further include a first subpixel electrode, which may be positioned at a first half of the display device, may be electrically connected to the first transistor, and may be configured to receive the first data voltage through the first transistor. The display device may further include a second subpixel electrode, which may be positioned at a second half of the display device, may be electrically connected to the second transistor, and may be configured to receive the second data voltage through the second transistor. A distance between a center of the display device and a structure of the first subpixel electrode may be equal to a distance between the center of the display device and a structure of the second subpixel electrode. The structure of the first subpixel may be a mirror image of the structure of the second subpixel electrode in a layout view of the display device.

The display device may include a gate line, which may be electrically connected to the first transistor and may be formed of a conductive material. The display device may further include a first storage electrode line, which may be formed of the conductive material and may overlap the first subpixel electrode. The display device may further include a second storage electrode line, which may be formed of the conductive material and may overlap the second subpixel electrode. A distance between the center of the display device and a structure of the first storage electrode line may be equal to a distance between the center of the display device and a structure of the second storage electrode line. The structure of the first storage electrode line may be a mirror image of the structure of the second storage electrode line in the layout view of the display device.

The display device may include an insulating layer, which may directly contact the first data line. The display device may further include a first reference voltage line, which may directly contact the insulating layer and may overlap the first subpixel electrode. The display device may further include a second reference voltage line, which may directly contact the insulating layer and may overlap the second subpixel electrode. A distance between the center of the display device and a structure of the first reference voltage line may be equal to a distance between the center of the display device and a structure of the second reference voltage line. The structure of the first reference voltage line may be a mirror image of the structure of the second reference voltage line in the layout view of the display device.

The first reference voltage line may include a first portion and a first plurality of parallel portions. The first portion may extend parallel to the first data line. The first plurality of parallel portions may be directly connected to the first portion and may extend perpendicular to the first portion. The second reference voltage line may include a second portion and a second plurality of parallel portions. The second portion may extend parallel to the second data line. The second plurality of parallel portions may be directly connected to the second portion and may extend perpendicular to the second portion. The first plurality of parallel portions and the second plurality of parallel portions may be positioned between the first portion and the second portion in a layout view of the display device.

The display device may include a third transistor. The display device may further include a fourth transistor. The display device may further include a third subpixel electrode, which may be electrically connected to the third transistor and may be aligned with the first subpixel electrode in a direction parallel to the first data line. The display device may further include a fourth subpixel electrode, which may be electrically connected to the fourth transistor and may be aligned with the second subpixel electrode in a direction parallel to the second data line. A distance between a center of the display device and a structure of the third subpixel electrode may be equal to a distance between the center of the display device and a structure of the fourth subpixel electrode. The structure of the third subpixel may be identical to the structure of the fourth subpixel electrode in the layout view of the display device, wherein both the first transistor and the third transistor may be electrically connected to a first gate line, wherein both the second transistor and the fourth transistor may be electrically connected to the first gate line or a second gate line. A length of the first subpixel electrode in the direction parallel to the first data line may be larger than a length of the third subpixel electrode in the direction parallel to the first data line.

An embodiment of the present invention may be related to a liquid crystal display device. The liquid crystal display device may include a display panel. The display panel may include the following elements: a lower display substrate including a plurality of pixel electrodes each including a first subpixel electrode and a second subpixel electrode; an upper display substrate including a common electrode; and a liquid crystal layer disposed between the lower display substrate and the upper display substrate. Each of the second subpixel electrodes of the pixel electrodes positioned in left and right regions of the display panel may include a unit electrode including a horizontal stem portion, a vertical stem portion, and a plurality of fine branch portions extending from the horizontal stem portion or the vertical stem portion, the vertical stem portion of each of the second subpixel electrodes of the pixel electrodes positioned in the left region of the display panel may be positioned at a left edge of the unit electrode, and the vertical stem portion of each of the second subpixel electrodes of the pixel electrodes positioned in the right region of the display panel may be positioned at a right edge of the unit electrode.

The second subpixel electrodes positioned in the left region of the display panel and the second subpixel electrodes positioned in the right region of the display panel may be symmetrical with respect to a central axis of the display panel.

The unit electrode may include two subregions in which tilting directions of liquid crystal molecules may be differently controlled, and the horizontal stem portion may form a boundary between the two subregions.

Each of the second subpixel electrodes of the pixel electrodes positioned in the left and right regions of the display panel may include a plurality of unit electrodes neighboring with a gap interposed therebetween in a vertical direction and electrically connected to each other.

The lower display substrate may further include a storage electrode line including a first storage electrode line positioned to correspond to the first subpixel region and a second storage electrode line positioned to correspond to the second subpixel region, The second storage electrode line positioned in the left region of the display panel may include a horizontal portion and a vertical portion connected to a left end portion of the horizontal portion The second storage electrode line positioned in the left region of the display panel may include a horizontal portion and a vertical portion connected to a right end portion of the horizontal portion.

The second storage electrode line positioned on the left region of the display panel may include a plurality of horizontal portions parallel to each other, and the vertical portion connects left end portions of the plurality of horizontal portions. The second storage electrode positioned in the right region of the display panel may include a plurality of horizontal portions parallel to each other, and the vertical portion connects right end portions of the plurality of horizontal portions.

The second storage electrode line positioned in the left region of the display panel and the second storage electrode line positioned in the right region of the display panel may be symmetrical with respect to the central axis of the display panel.

The lower display substrate may further include a reference voltage line including a first part positioned to correspond to the first subpixel region and a second part positioned to correspond to the second subpixel region. The second part of the reference voltage line positioned in the left region of the display panel may include a horizontal portion and a vertical portion connected to a left end portion of the horizontal portion. The second part of the reference voltage line positioned in the right region of the display panel may include a horizontal portion and a vertical portion connected to a right end portion of the horizontal portion.

The second part of the reference voltage line positioned in the left region of the display panel may include a plurality of horizontal portions parallel to each other and the vertical portion may connect left end portions of the horizontal portions. The second part of the reference voltage line positioned in the right region of the display panel may include a plurality of horizontal portions parallel to each other and the vertical portion may connect right end portions of the horizontal portions. The second part of the reference voltage line positioned in the left region of the display panel and the second part of the reference voltage line positioned in the right region of the display panel may be symmetrical with respect to the central axis of the display panel.

The second part of the reference voltage line may overlap the vertical stem portion of the second subpixel electrode.

The first and second subpixel electrodes of the pixel electrodes positioned in a central region of the display panel may include a cross stem portion including a horizontal stem portion and a vertical stem portion and a plurality of fine branch portions extending from the cross stem portion.

The lower display substrate may further include a reference voltage line including a first part positioned to correspond to the first subpixel region and a second part positioned to correspond to the second subpixel region. The first and second parts of the reference voltage line positioned in the central region of the display panel may overlap the vertical stem portions of the first and second subpixel electrodes positioned in the central region of the display panel.

Each of the first subpixel electrodes of the pixel electrodes positioned in the left and right regions of the display panel may include a unit electrode including a horizontal stem portion, a vertical stem portion, and a plurality of fine branch portions extending from the horizontal stem portion or the vertical stem portion. Each of the vertical stem portions of the first subpixel electrodes of the pixel electrodes positioned in the left region of the display panel may be positioned at a left edge of the unit electrode. Each of the vertical stem portions of the first subpixel electrodes of the pixel electrodes positioned in the right region of the display panel may be positioned at a right edge of the unit electrode.

The first subpixel electrode positioned in the left region of the display panel and the first subpixel electrode positioned in the right region of the display panel may be symmetrical with respect to the central axis of the display panel.

Each first subpixel electrode of the pixel electrodes positioned in the left and right regions of the display panel may include a plurality of unit electrodes neighboring with a gap interposed therebetween in a vertical direction and electrically connected to each other. Each of the unit electrodes includes two subregions in which tilting directions of liquid crystal molecules may be differently controlled, and the horizontal stem portion may form a boundary between the two subregions.

The lower display substrate may further include a reference voltage line including a first part positioned to correspond to the first subpixel region and a second part positioned to correspond to the second subpixel region. Each of the first and second parts of the reference voltage line positioned in the left region of the display panel includes a horizontal portion and a vertical portion connected to a left end portion of the horizontal portion. Each of the first and second parts of the reference voltage line positioned in the right region of the display panel may include a horizontal portion and a vertical portion connected to a right end portion of the horizontal portion.

Each of the first and second parts of the reference voltage line positioned in the left region of the display panel may include a plurality of horizontal portions and the vertical portion may connect left end portions of the horizontal portions. Each of the first and second parts of the reference voltage line positioned in the right region of the display panel may include a plurality of horizontal portions and the vertical portion connects right end portions of the horizontal portions.

The first and second parts of the reference voltage line positioned in the left region of the display panel and the first and second parts of the reference voltage line positioned in the right region of the display panel may be symmetrical with respect to the central axis of the display panel.

The display panel may be a curved display panel.

According to embodiments of the present invention, structures of subpixel electrodes, storage electrode lines, and/or reference voltage lines positioned at a first half (e.g., left half) of a display device may substantially mirror structures of subpixel electrodes, storage electrode lines, and/or reference voltage lines positioned at a second half (e.g., right half) of the display device. The mirrored configuration may correspond to the different (e.g., substantially mirrored) upper-lower substrate misalignment directions in the first half (e.g., left half) of the display device and the second half (e.g., right half) of the display device. As a result, undesirable texture displayed in images may be substantially minimized, and/or luminance of displayed images may be substantially maximized. Advantageously, the display device may display images with satisfactory quality.

BRIEF DESCRIPTION OF THE DRAWINGS

FIG. 12 is a schematic layout view illustrating a pixel electrode associated with the pixel illustrated in FIG. 10 according to an embodiment of the present invention.

DETAILED DESCRIPTION OF THE EMBODIMENTS

Figure 1:
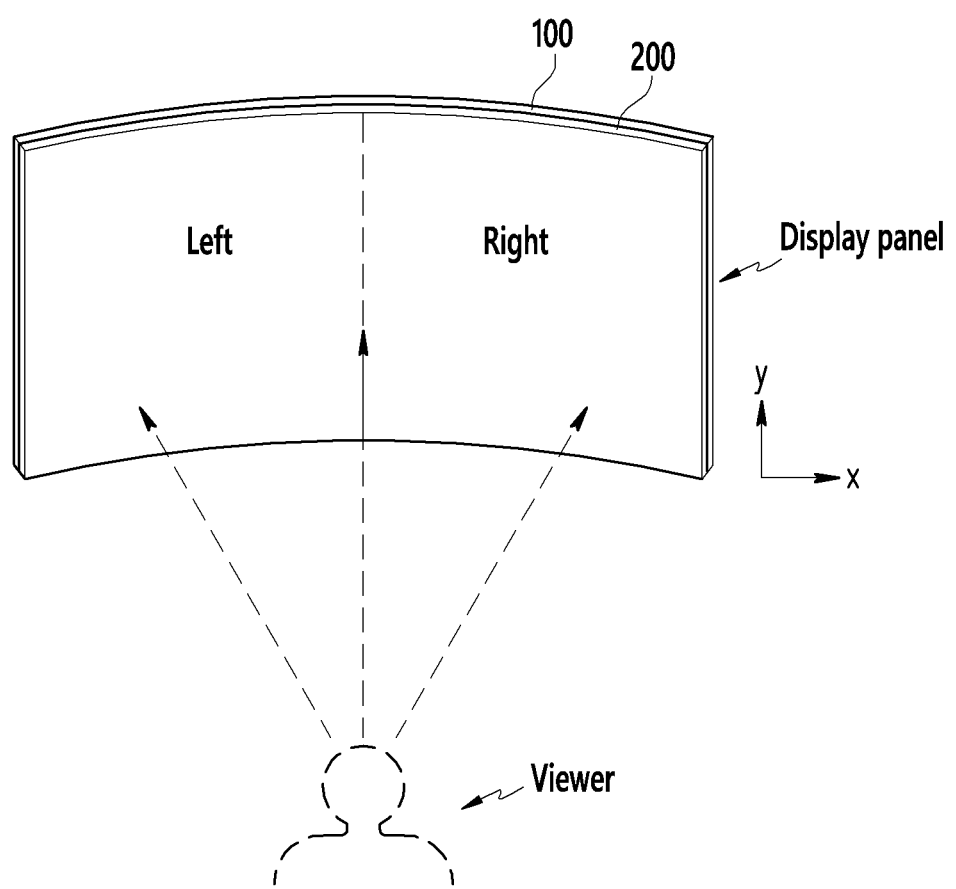
FIG. 1 is a schematic view illustrating a curved display panel of a display device, e.g., a liquid crystal display (LCD) device, according to an embodiment of the present invention.

Embodiments of the present invention are described with reference to the accompanying drawings. As those skilled in the art would realize, the described embodiments may be modified in various different ways, all without departing from the spirit or scope of the present invention.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the drawings, thicknesses of layers, films, panels, regions, etc., may be exaggerated for clarity. Like reference numerals may designate like elements in the specification. When a first element (such as a layer, film, region, or substrate) is referred to as being "on" a second element, the first element can be directly on the second element, or one or more intervening elements may also be present. In contrast, when a first element is referred to as being "directly on" a second element, there are no intended intervening elements between the first element and the second element.

In the description, the term "connect" may mean "electrically connect"; the term "insulate" may mean "electrically insulate".

FIG. 1 is a schematic view illustrating a curved display panel of a display device, e.g., a liquid crystal display (LCD) device, according to an embodiment of the present invention.

Referring to FIG. 1, the LCD device includes a display panel. Although not shown, the LCD device includes a gate driving unit and a data driving unit for controlling the display panel, and a signal control unit for controlling the driving units. The LCD device may include a backlight unit (not shown) for providing light to the display panel from a rear side of the display panel.

The display panel includes a display substrate 100 (which may be a lower substrate when a display side of the display panel is positioned above a non-display side of the display panel), a display substrate 200 (which may be an upper substrate when the display side of the display panel is positioned above the non-display side of the display panel), and a light-regulating layer, e.g., a liquid crystal layer (not shown), interposed between the substrates 100 and 200. A plurality of pixels PX may be disposed, for example, in a matrix (or array) form in the display panel. Alignment layers (not shown) are formed on inner surfaces of the two display substrates 100 and 200, and these alignment layers may be vertical alignment layers. Polarizers (not shown) may be attached to outer surfaces of the two display substrates 100 and 200, and polarization axes of the two polarizers may be perpendicular to each other.

The display panel may have a substantially uniform thickness has and may have a curved surface that is curved with respect to the vertical y axis, which is perpendicular to the horizontal x axis. The curved surface is a concave surface in which a central portion of the display panel may be substantially recessed relative to left and right edges of the display panel when viewed from a point in front of the display side of the display panel, on which images are to be displayed. Thus, when a viewer views the display panel, a difference between a distance from the viewer to the central portion of the display panel and distances from the viewer to the left and right edges may be minimized, such that viewing experience of the viewer may be enhanced.

Two curved display substrates 100 and 200 may be misaligned due to a difference in stress applied to the two display substrates 100 and 200. For example, in a first half of the display device, e.g., in the left region of the curved display panel with reference to the viewer, the display substrate 100 may be misaligned toward the left-side direction with respect to the display substrate 200; in a second half of the display device, e.g., in the right region of the curved display panel with reference to the viewer, the display substrate 100 may be misaligned toward the right-side direction with respect to the display substrate 200. Embodiments of the present invention may enable the display device to display images with substantially satisfactory quality despite the different misalignment directions.

Figure 2:
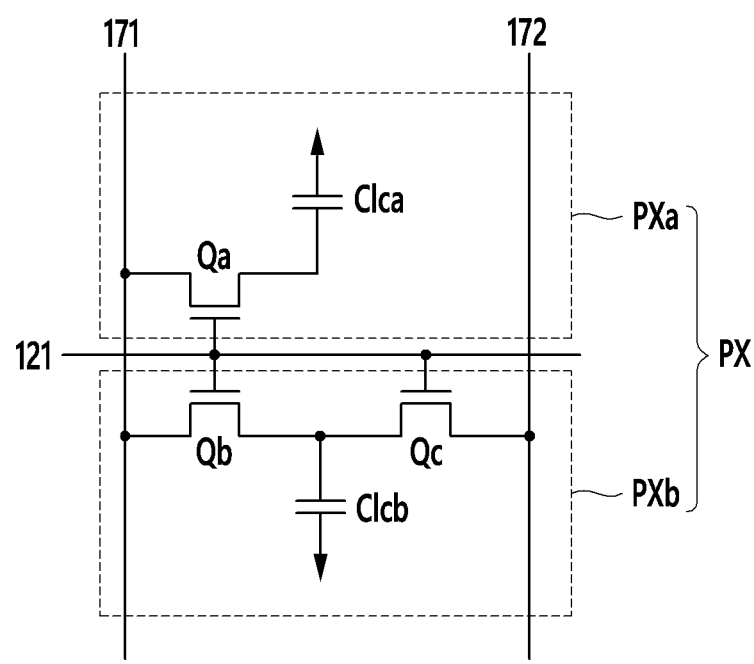
FIG. 2 is an equivalent circuit diagram illustrating a pixel of the LCD device according to an embodiment of the present invention.

FIG. 2 is an equivalent circuit diagram illustrating a pixel of the LCD device according to an embodiment of the present invention.

Referring to FIG. 2, the LCD device according to an embodiment of the present invention includes a pixel, and the pixel is arranged in a matrix direction on the display panel. The pixel PX is a minimum unit displaying an image, and one pixel PX may display any one of primary colors. For example, one pixel may display any one among red, green, and blue colors, and the colored pixels may be repeatedly disposed in particular order. According to an embodiment, the pixel may further include a white pixel W displaying white color.

One pixel PX may include a first subpixel PXa and a second subpixel PXb. The first subpixel PXa and the second subpixel PXb may display an image according to different gamma curves or may display an image according to the same gamma curve, with respect to a single input image signal. That is, the first subpixel PXa and the second subpixel PXb of one pixel PX may display images of different luminance to enhance lateral visibility with respect to one input image signal. The first subpixel PXa and the second subpixel PXb may have areas equal to each other or different from each other. The pixel PX including the first subpixel PXa and the second subpixel PXb may have various circuit structures and dispositions to display images of different luminance A gate line 121, a data line 171, and a reference voltage line 172*l* for transmitting a reference voltage are connected to the pixel PX.

The first subpixel PXa includes a first switching element Qa and a first liquid crystal capacitor Clca, and the second subpixel PXb includes a second and third switching elements Qb and Qc and a second liquid crystal capacitor Clcb. The first switching element Q1 and the second switching element Qb are connected to the gate line 121 and the data line 171, respectively, and the third switching element Qc is connected to an output terminal of the second switching element Qb and the reference voltage line 172*l*. An output terminal of the first switching element Qa is connected to the first liquid crystal capacitor Clca, and the output terminal of the second switching element Qb is connected between the second liquid crystal capacitor Clcb and an input terminal of the third switching element Qc. A control terminal of the third switching element Qc is connected to the gate line 121, an input terminal thereof is connected to the second liquid crystal capacitor Clcb, and an output terminal thereof is connected to the reference voltage line 172*l*.

Referring to an operation of the pixel PX illustrated in FIG. 2, first, when a gate ON voltage is applied to the gate line 121, the first switching element Qa, the second switching element Qb, and the third switching element Qc connected to the gate line 121 are turned on. Thus, a data voltage applied to the data line 171 is applied to the first liquid crystal capacitor Clca and the second liquid crystal capacitor Clcb, respectively, through the first switching element Qa and the second switching element Qb in the turned-on state, and the first liquid crystal capacitor Clca and the second liquid crystal capacitor Clcb are charged by a difference between the data voltage and the common voltage. Here, the same data voltage is transmitted to the first liquid crystal capacitor Clca and the second liquid crystal capacitor Clcb through the first and second switching elements Qa and Qb, but a charge voltage of the second liquid crystal capacitor Clcb is divided by the third switching element Qc. Thus, since the charge voltage of the second liquid crystal capacitor Clcb is smaller than the charge voltage of the first liquid crystal capacitor Clca, luminance of the two subpixels PXa and PXb may be varied. Thus, when the voltage charged in the first liquid crystal capacitor Clca and the voltage charged in the second liquid crystal capacitor Clcb are appropriately adjusted, an image viewed from the side may approximate to an image viewed from the front side. This means that lateral visibility is enhanced.

In an embodiment, the third switching element Qc connected to the second liquid crystal capacitor Clcb and the reference voltage line 172*l* is included to vary the voltage charged in the first liquid crystal capacitor Clca and the voltage charged in the second liquid crystal capacitor Clcb, but any other configuration may be provided according to embodiments. For example, the second liquid crystal capacitor Clcb may be connected to a step-down capacitor. In detail, a third switching element including a first terminal connected to a step-down gate line, a second terminal connected to the second liquid crystal capacitor Clcb, and a third terminal connected to the step-down capacitor may be included to charge a portion of an amount of an electric charge charged in the second liquid crystal capacitor Clcb to the step-down capacitor, whereby charge voltages of the first liquid crystal capacitor Clca and the second liquid crystal capacitor Clcb may be set to be different. In another example, the first liquid crystal capacitor Clca and the second liquid crystal capacitor Clcb may be connected to different data lines to receive different data voltages, whereby charge voltages of the first liquid crystal capacitor Clca and the second liquid crystal capacitor Clcb may be set to be different. According to embodiments, a single pixel may not be divided into subpixels.

Figure 3:
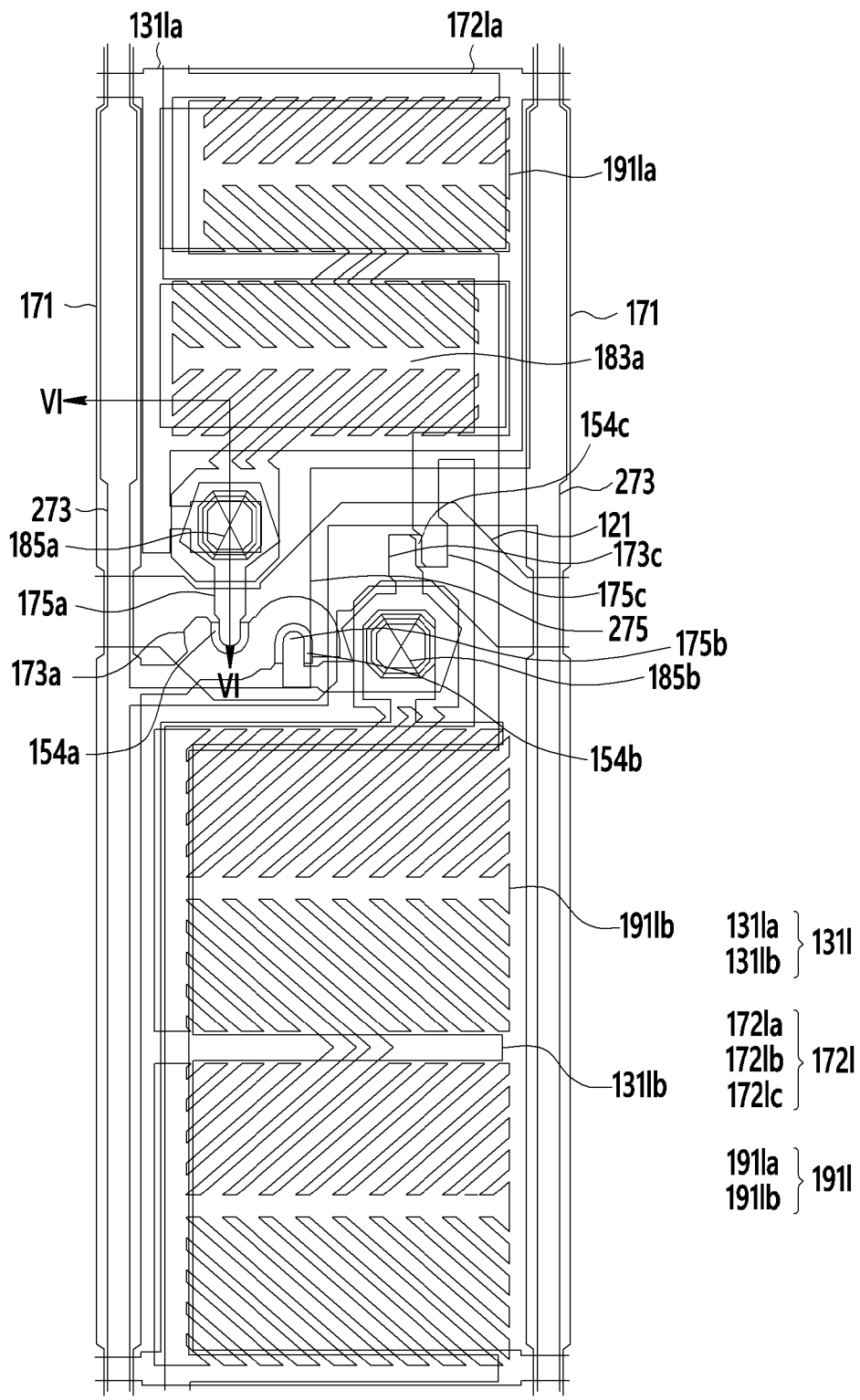
FIG. 3 is a schematic layout view illustrating a pixel of pixels positioned in a first half (e.g., a left region) of the LCD device in a layout view of the LCD device according to an embodiment of the present invention.
Figure 4:
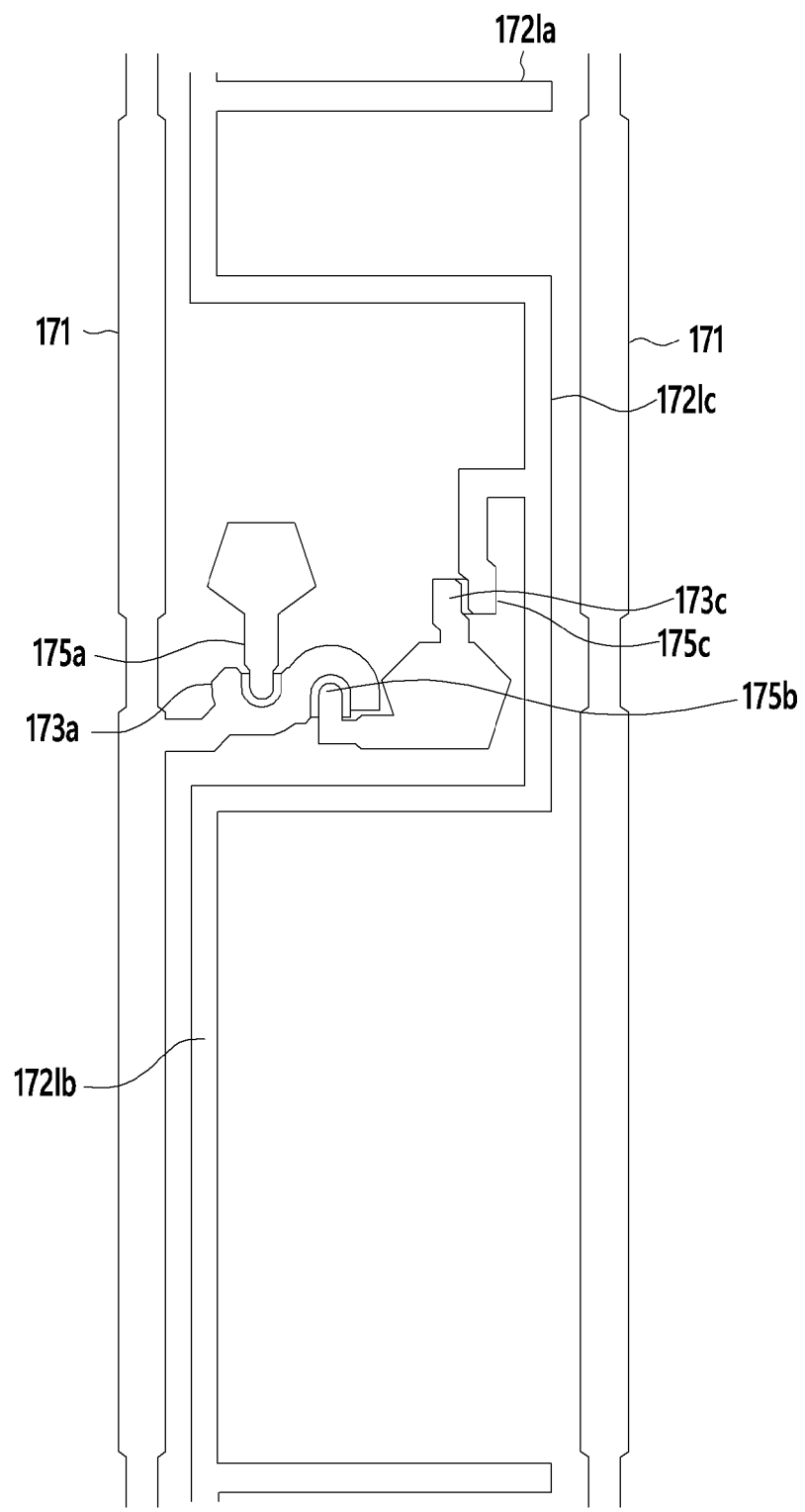
FIG. 4 is a schematic layout view illustrating a data line and a reference voltage line associated with the pixel illustrated in FIG. 3 according to an embodiment of the present invention.
Figure 5:
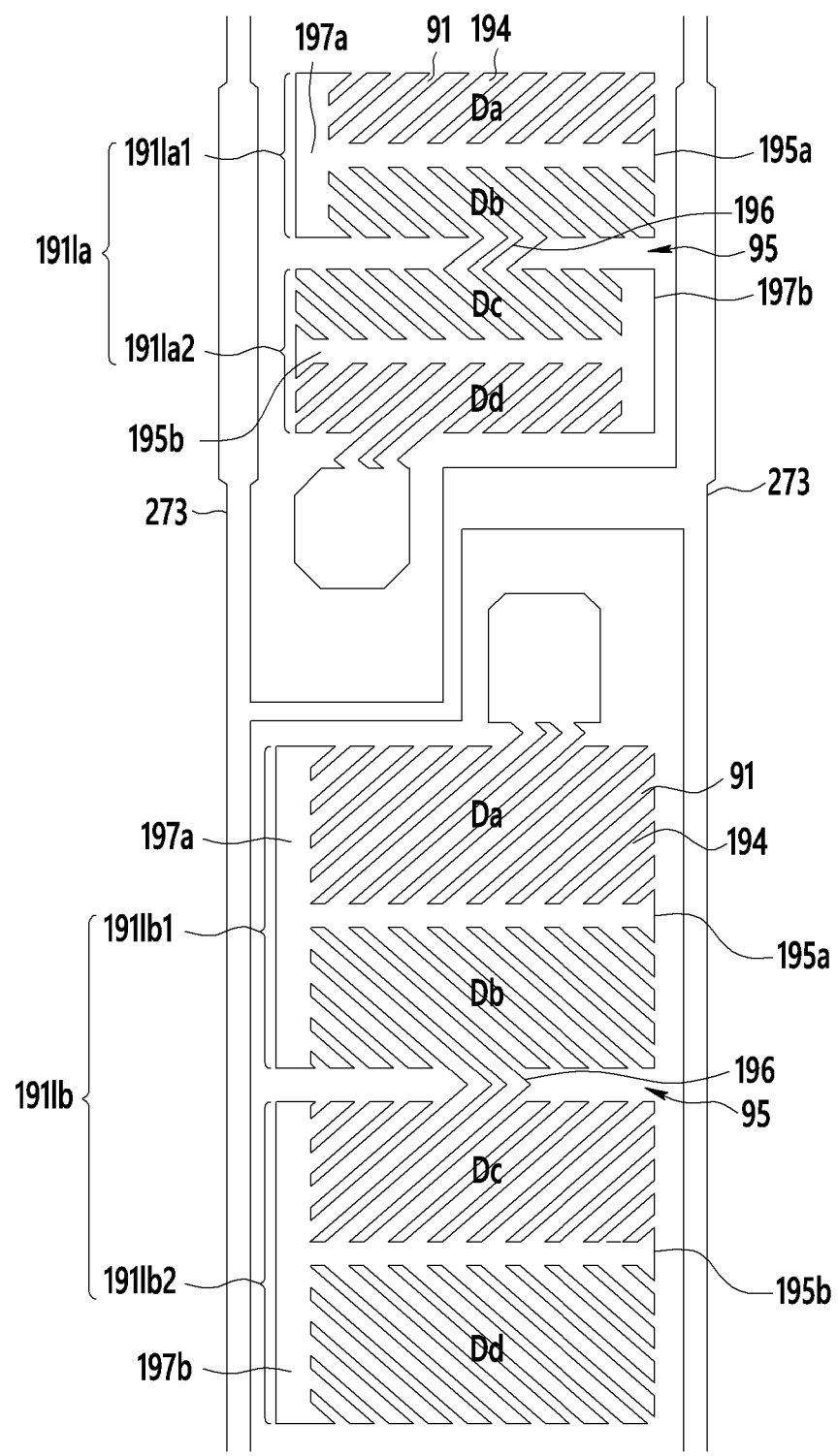
FIG. 5 is a schematic layout view illustrating a pixel electrode and a shielding electrode associated with the pixel illustrated in FIG. 3 according to an embodiment of the present invention.
Figure 6:
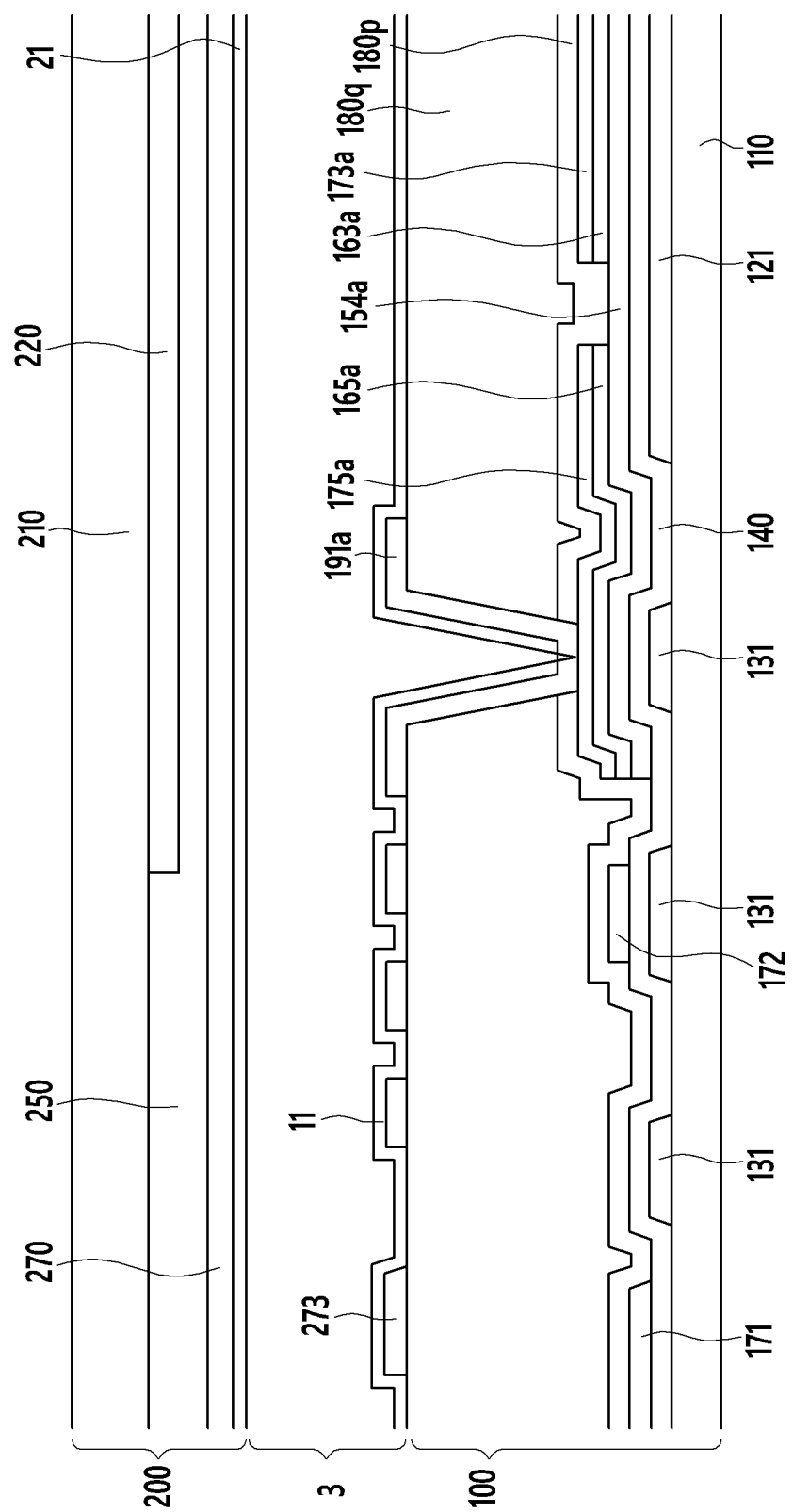
FIG. 6 is a cross-sectional view taken along a line VI-VI indicated in FIG. 3.
Figure 7:
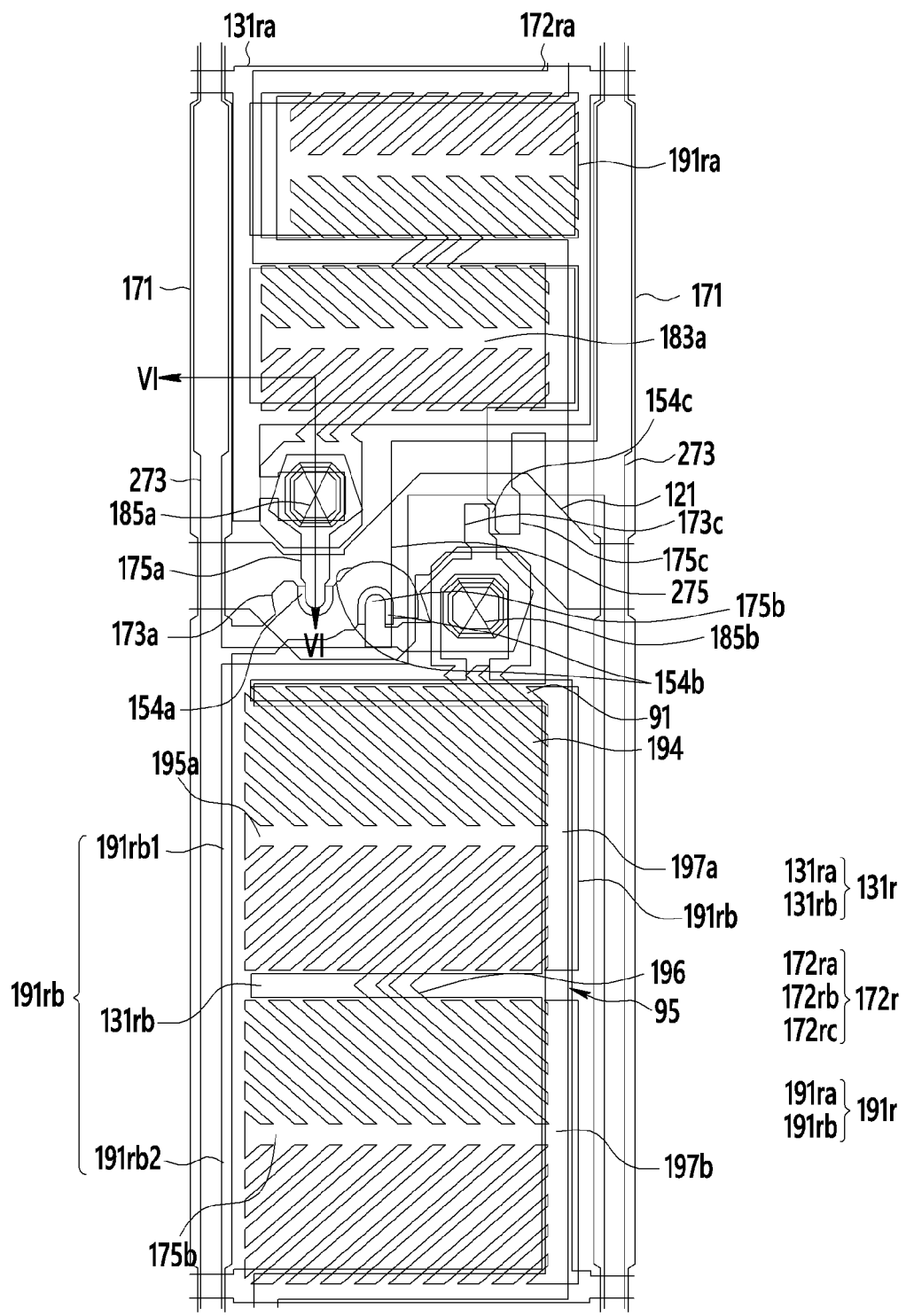
FIG. 7 is a schematic layout view illustrating a pixel of pixels positioned in a second half (e.g., a right region) of the LCD device in the layout view of the LCD device according to an embodiment of the present invention.
Figure 8:
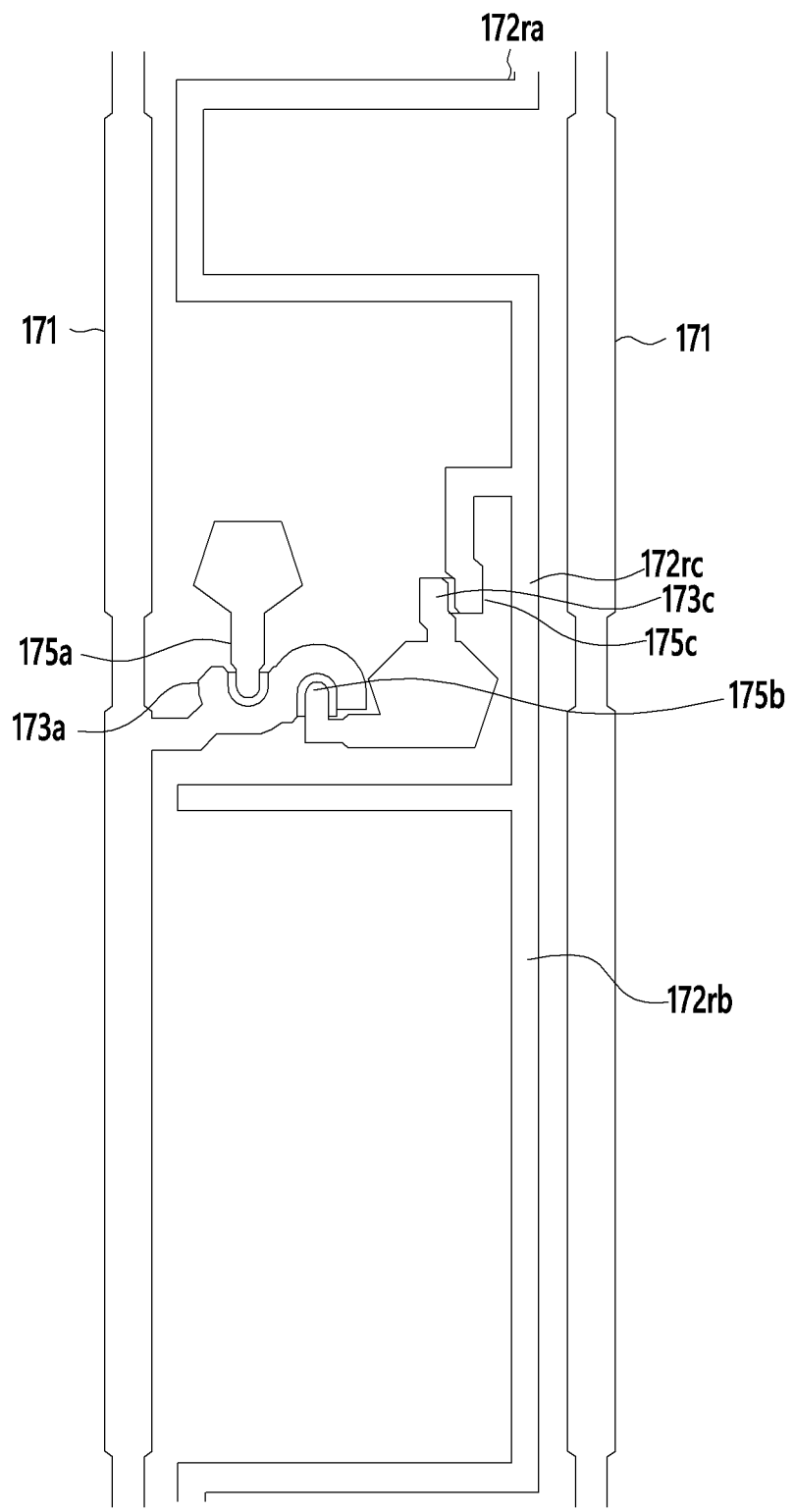
FIG. 8 is a schematic layout view illustrating a data line and a reference voltage line associated with the pixel illustrated in FIG. 7 according to an embodiment of the present invention.
Figure 9:
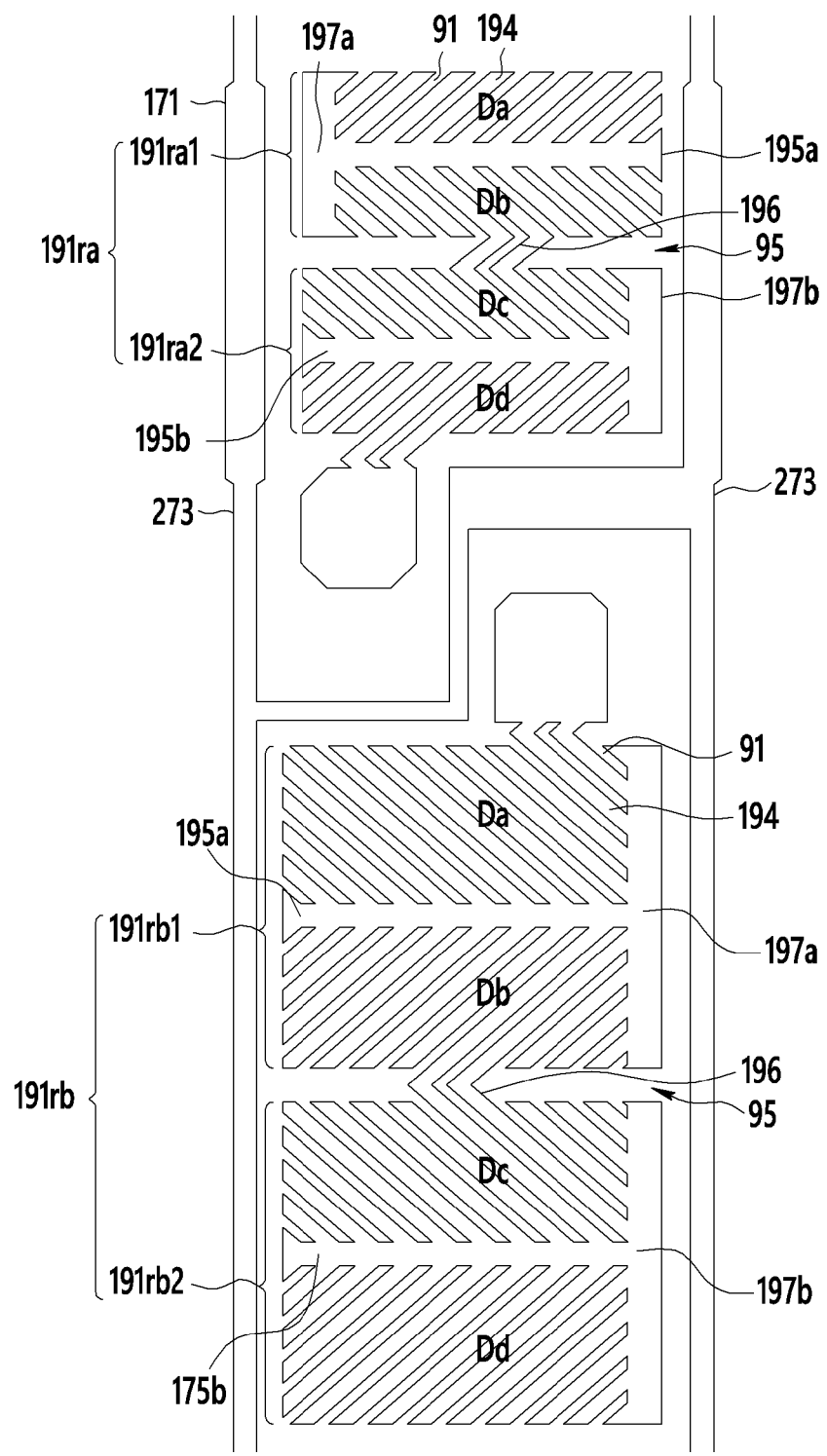
FIG. 9 is a schematic layout view illustrating a pixel electrode and a shielding electrode associated with the pixel illustrated in FIG. 7 according to an embodiment of the present invention.

FIG. 3 is a schematic layout view illustrating a pixel of pixels positioned in a first half (e.g., a left region) of the LCD device in a layout view of the LCD device according to an embodiment of the present invention. FIG. 4 is a schematic layout view illustrating a data line and a reference voltage line associated with the pixel illustrated in FIG. 3 according to an embodiment of the present invention. FIG. 5 is a schematic layout view illustrating a pixel electrode and a shielding electrode associated with the pixel illustrated in FIG. 3 according to an embodiment of the present invention. FIG. 6 is a cross-sectional view taken along a line VI-VI indicated in FIG. 3. FIG. 7 is a schematic layout view illustrating a pixel of pixels positioned in a second half (e.g., a right region) of the LCD device in the layout view of the LCD device according to an embodiment of the present invention. FIG. 8 is a schematic layout view illustrating a data line and a reference voltage line associated with the pixel illustrated in FIG. 7 according to an embodiment of the present invention. FIG. 9 is a schematic layout view illustrating a pixel electrode and a shielding electrode associated with the pixel illustrated in FIG. 7 according to an embodiment of the present invention. The pixel illustrated in FIG. 3 may be substantially aligned with the pixel illustrated in FIG. 7 in a direction parallel to the x axis in the layout view of the LCD device. The distance between the pixel illustrated in FIG. 3 and a center of the LCD device (e.g., the boundary between the left region and the right region illustrated in FIG. 1) may be substantially equal to the distance between the pixel illustrated in FIG. 7 and the center of the LCD device in the layout view of the LCD device.

Misalignment of the display substrates 100 and 200 may have different directions (e.g., substantially mirrored directions) in the left region and the right region of the display panel. According to an embodiment of the present invention, pixels positioned in the left region of the display panel and pixels positioned in the right region of the display panel may have different structures (e.g., substantially mirrored structures) in order to enable the LCD device to display images with substantially satisfactory quality.

First, pixels positioned in the left region of the display panel will be described in detail with reference to FIGS. 3 through 6.

The LCD device includes a display panel including the lower display substrate 100 and the upper display substrate 200 facing each other, and a liquid crystal layer 3 positioned between the two display substrates 100 and 200.

Referring to the lower display substrate 100, a gate conductor including a gate line 121 and a storage electrode line 131*l* is formed on an insulating substrate 110 formed of transparent glass, plastic, and the like.

The gate line 121 includes a large end portion (not shown) for contacting with a gate electrode and any other layer or an external driving circuit. The gate line 121 may be formed of an aluminum-based metal such as aluminum (Al), an aluminum alloy, and the like, a silver-based metal such as silver (Ag), a silver alloy, and the like, a copper-based metal such as copper (Cu), a copper alloy, and the like, a molybdenum-based metal such as molybdenum (Mo), a molybdenum alloy, and the like, chromium (Cr), tantalum (Ta), or titanium (Ti). The gate line 121 may have multilayer structure including at least two different conductive films having different physical properties.

The gate line 121 may extend mainly in a horizontal direction and may be formed to traverse one pixel region having a substantially quadrangular shape. In one pixel region, an upper region of the gate line 121 is a first subpixel region displaying a high gray level and a lower region of the gate line 121 is a second subpixel region displaying a low gray level. The first and second subpixel regions may have a substantially quadrangular shape, and the second subpixel region may be greater than the first subpixel region. The first subpixel region may be substantially identical to a region occupied by the first subpixel electrode 191*la*, and the second subpixel region may be substantially identical to a region occupied by a second subpixel electrode 191*lb*.

The storage electrode line 131*l* may be formed of the same material as that of the gate line 121, and may be formed together with the gate line 121. The storage electrode line 131*l* may include a first storage electrode line 131*la* positioned above the gate line 121 and a second storage electrode line 131*lb* positioned below the gate lines 121.

The first storage electrode line 131*la* may have a quadrangular shape surrounding four corners of the first subpixel region and bisecting the second subpixel region substantially in a horizontal direction. For example, the first storage electrode line 131*la* may include three horizontal portions parallel to each other and two vertical portions respectively connecting both ends of the three horizontal portions, and may have a shape similar to a number 8 displayed by a seven-segment display. The horizontal portion positioned in the uppermost or lowermost portion of the first storage electrode line 131*la* may extend, beyond one pixel region, in a horizontal direction so as to be connected to a different layer or an external driving circuit.

The second storage electrode line 131*lb* may be formed to surround three edges excluding the right edge of the second subpixel region. For example, the second storage electrode line 131*lb* may include three horizontal portions parallel to each other and one vertical portion connecting left end portions of the three horizontal portions, and may have a shape similar to capitalized letter E displayed by a seven-segment display. The horizontal portion of the second storage electrode line 131*lb* is positioned substantially on the left edge of the second subpixel region. The vertical portion of the second storage electrode line 131*lb* is not positioned in the vicinity of the right edge of the second subpixel region. The horizontal portion positioned in the lowermost or uppermost portion of the second storage electrode line 131*lb* may extend in a horizontal direction, beyond one pixel region, in a horizontal direction so as to be connected to a different layer or an external driving circuit. The horizontal portion positioned in the lowermost portion of the second storage electrode line 131*lb* may be the same as a horizontal portion positioned in the uppermost portion of the first storage electrode line 131*la* of a different pixel region adjacent in the vertical direction.

A gate insulating layer 140 is formed on the gate conductor, and a first semiconductor 154*a*, a second semiconductor 154*b*, and a third semiconductor 154*c* may be formed on the gate insulating layer 140. A plurality of resistive contact members 163*a*, 165*a*, 163*b*, 165*b*, 163*c*, and 165*c* may be formed on the semiconductors 154*a*, 154*b*, and 154*c*. A data conductor including the data line 171 and the reference voltage line 172*l* is formed on the resistive contact members 163*a*, 165*a*, 163*b*, 165*b*, 163*c*, and 165*c*, and the gate insulating layer 140.

The data conductor includes the data line 171, a first drain electrode 175*a*, a second drain electrode 175*b*, and the reference voltage line 172*l*. The data line 171 extends substantially in the vertical direction along one pixel region, and includes a first source electrode 173*a* and a second source electrode 173*b*. The reference voltage line 172*l* includes a third drain electrode 175*c*. The second drain electrode 175*b* is connected to a third source electrode 173*c*, and includes an extending portion.

Referring to FIG. 4, the reference voltage line 172*l* includes a first part 172*la* positioned in the first subpixel region above the gate line 121, a second part 172*lb* positioned in the second subpixel region below the gate line 121, and a third part 172*lc* connecting the first and second parts 172*la* and 172*lb*.

The first part 172*la* of the reference voltage line 172*l* may include, for example, two horizontal portions parallel to each other, a vertical portion connecting left end portions of the two horizontal portions, and a vertical portion downwardly connected to a right end portion of one horizontal portion, forming a shape similar to a number 5 displayed by a seven-segment display less the bottom segment. The two horizontal portions may be positioned in a substantially upper edge of the first subpixel region and a substantially central portion of the first subpixel region, and the two vertical portions may be positioned substantially in left and right edges of the first subpixel region. According to an embodiment, the first part 172*la* may further include a horizontal portion positioned in a substantially lower edge of the first subpixel region, and one vertical portion may connect left end portions of the two upper horizontal portions and the other vertical portion may connect two lower horizontal portions and the right end portion to form a shape similar to a number 5 displayed by a seven-segment display.

The second part 172*lb* of the reference voltage line 172*l* may include, for example, two horizontal portions parallel to each other and one vertical portion connecting left end portions of the two horizontal portions, forming a shape similar to a capitalized letter C displayed by a seven-segment display. The two horizontal portions may be positioned substantially in an upper edge of the second subpixel region and a lower edge of the second subpixel region, respectively, and the vertical portion may be positioned substantially in a left edge of the second subpixel region. The vertical portion of the second part 172*l*b is not positioned in the vicinity of the right edge of the second subpixel region. According to an embodiment, the second part 172*b* may further include a horizontal portion positioned in a substantially central portion between the upper edge and the lower edge of the second subpixel region, and the vertical portion may connect left end portions of the three horizontal portions to form a shape similar to a capitalized letter E displayed by a seven-segment display.

The third part 172*l*c of the reference voltage line 172*l* connects a lower end portion of the right vertical portion of the first part 172*l*a and a right end portion of the upper horizontal portion of the second part 172*l*b. A portion of the third part 172*l*c may be branched to become a third drain electrode 175*c*.

The first gate electrode 124*a*, the first source electrode 173*a*, and the first drain electrode 175*a* may form one first switching element Qa as a thin film transistor (TFT) together with the first semiconductor 154*a*, and a channel of the TFT is formed in the first semiconductor 154*a* part between the first source electrode 173*a* and the first drain electrode 175*a*. Similarly, the second gate electrode 124*b*, the second source electrode 173*b*, and the second drain electrode 175*b* form one second switching element Qb together with the second semiconductor 154*b*, and the third gate electrode 124*c*, the third source electrode 173*c*, and the third drain electrode 175*c* form one third switching element Qc together with the third semiconductor 154*c*. In this manner, since the TFT is formed in the lower display substrate 100, the lower display substrate 100 is called a TFT display substrate.

A first passivation layer 180*p* is formed on exposed portions of the data conductor and the semiconductors 154*a*, 154*b*, and 154*c*. The first passivation layer 180*p* may include an inorganic insulating layer such as a silicon nitride (SiN$_x$) or a silicon oxide (SiO$_x$). When a second passivation layer 180*q* is a color filter, the first passivation layer 180*p* may prevent pigment of the color filer 230 from being introduced to the exposed portions of the semiconductors 154*a*, 154*b*, and 154*c*.

The second passivation layer 180*q* is formed on the first passivation layer 180*p*. The second passivation layer 180*q* may be a color filter, or may be omitted. When the second passivation layer 180*q* is a color filter, the second passivation layer 180*q* may uniquely display one of primary colors.

A first contact hole 185*a* and a second contact hole 185*b* exposing the first drain electrode 175*a* and the second drain electrode 175*b* are formed in the first passivation layer 180*p* and the second passivation layer 180*q*, respectively.

A plurality of pixel electrodes 191*l* may be formed on the second passivation layer 180*q*, and an alignment layer 11 may be formed on the pixel electrode 191*l*. Each pixel 191*l* includes a first subpixel 191*l*a and a second subpixel 191*l*b, and the first subpixel electrode 191*l*a and the second subpixel electrode 191*l*b are separated with the gate line 121 interposed therebetween. The second subpixel electrode 191*l*b may be formed to be greater than the first subpixel electrode 191*l*a.

The pixel electrode 191*l* may be formed of a transparent conductive material TCO such as an indium tin oxide (ITO) or an indium zinc oxide (IZO), or may be formed of a reflective metal such as aluminum (Al), silver (Ag), chromium (Cr), or an alloy thereof. Each pixel electrode 191*l* may be connected to the data line 171 on the left side thereof. In an embodiment, each pixel electrode 191*l* may be connected to the data line 171 on the right side thereof.

The first and second subpixels 191*l*a and 191*l*b will be described in more detail with reference to FIG. 5.

The first subpixel electrode 191*l*a includes a plurality of unit electrodes, for example, an upper unit electrode 191*l*a1 and a lower unit electrode 191*l*a2 having a quadrangular shape overall and neighboring with a gap 95 interposed therebetween.

The upper unit electrode 191*l*a1 and the lower unit electrode 191*l*a2 may have the substantially same size (in particular, area). The upper unit electrode 191*l*a1 and the lower unit electrode 191*l*a2 may be electrically connected through at least one connection portion 196. A connection portion 196 may be formed on the same layer as that of the first subpixel electrode 191*l*a and formed of the same material as that of the first subpixel electrode 191*l*a. As illustrated, the connection portion 196 may be positioned substantially in the center of the first subpixel electrode 191*l*a, or may be positioned substantially in left and/or right edge of the first subpixel electrode 191*l*a.

The upper unit electrode 191*l*a1 includes at least one horizontal stem portion 195*a* and at least one vertical stem portion 197*a* connected thereto. The vertical stem portion 197*a* mainly extends in a vertical direction, and defines one edge, for example, a left edge, of the upper unit electrode 191*l*a1. The horizontal stem portion 195*a* may extend, starting from the substantially center of the vertical stem portion 197*a*, in a horizontal direction substantially perpendicular to the vertical stem portion 197*a*.

The lower unit electrode 191*l*a2 may have a shape substantially horizontally symmetrical to the shape of the upper unit electrode 191*l*a 1 in a reversed manner. That is, the lower unit electrode 191*l*a2 includes at least one horizontal stem portion 195*b* and at least one vertical stem portion 197*b* connected thereto. The vertical stem portion 197*b* extends mainly in a vertical direction and defines one edge, for example, a right edge, of the lower unit electrode 191*l*a2. The horizontal stem portion 195*b* may extend, starting from the substantially center of the vertical stem portion 197*b*, in a horizontal direction substantially perpendicular to the vertical stem portion 197*b*.

Lengths of the horizontal stem portions 195*a* and 195*b* may be greater than those of the vertical stem portions 197*a* and 197*b*.

The horizontal stem portions 195*a* and 195*b* may include a portion having a changed width, and the horizontal stem portions 195*a* and 195*b* may have the largest width in a position connected to the vertical stem portions 197*a* and 197*b*. As for the portion having a changed width of each of the horizontal stem portions 195*a* and 195*b*, the width may be reduced, starting from the portion connected to the vertical stem portions 197*a* and 197*b*, in a direction away from the vertical stem portions 197*a* and 197*b*.

Each of the vertical stem portions 197*a* and 197*b* may include a portion having a changed width, and the vertical stem portions 197*a* and 197*b* may have the largest width in a position connected to the horizontal stem portions 195*a* and 195*b*. As for the portion having a changed width of each of the vertical stem portions 197*a* and 197*b*, the width may be reduced, starting from the portion connected to the horizontal stem portions 195*a* and 195*b*, in a direction away from the horizontal stem portions 195*a* and 195*b*.

The first subpixel electrode 191*l*a is divided into a plurality of subregions Da, Db, Dc, and Dd by the horizontal stem portions 195*a* and 195*b*, the vertical stem portions 197*a* and 197*b*, and a gap 95. The horizontal stem portions 195*a* and 195*b*, the vertical stem portions 197*a* and 197*b*, and a gap 95 form boundaries between the neighboring subregions Da, Db, Dc, and Dd.

The first subpixel electrode 191*la* includes a plurality of fine branch portions 194 formed in each of the subregions Da, Db, Dc, and Dd. The fine branch portions 194 may slantingly extend outwardly from the horizontal stem portions 195*a* and 195*b* or the vertical stem portions 197*a* and 197*b*. Fine slits 91 are positioned between neighboring fine branch portions 194, from which the electrodes have been removed.

The fine branch portions 194 of the different subregions Da, Db, Dc, and Dd of one first subpixel electrode 191*la* may extend in different directions. In particular, the fine branch portions 194 of the adjacent subregions Da, Db, Dc, and Dd may be at an angle about 90 degrees or 180 degrees. In each of the subregions Da, Db, Dc, and Dd, the directions in which the fine branch portions 194 extend may be uniform. In detail, among the subregions Da and Db defined by the horizontal stem portion 195*a* and the vertical stem portion 197*a*, the fine branch portions 194 of the upper first subregion D1 may extend right upwardly from the horizontal stem portion 195*a* or the vertical stem portion 197*a*, and the fine branch portions 194 of the lower second subregion Db may extend right downwardly from the horizontal stem portion 195*a* or the vertical stem portion 197*a*. Also, among the subregions Da and Db defined by the horizontal stem portion 195*a* and the vertical stem portion 197*a*, the fine branch portions 194 of the upper first subregion D1 may extend right upwardly from the horizontal stem portion 195*a* or the vertical stem portion 197*a*, and the fine branch portions 194 of the lower second subregion Db may extend right downwardly from the horizontal stem portion 195*a* or the vertical stem portion 197*a*. A portion of the fine branch portions 194 of the subregion Dd is connected to an extending portion of the first subpixel electrode 191*la* to receive a voltage from the first drain electrode 175*a* connected through the first contact hole 185*a* (please refer to FIGS. 1 and 2).

The second subpixel electrode 191*lb* is formed to be similar to the first subpixel electrode 191*la*. Namely, the second subpixel electrode 191*lb* includes an upper unit electrode 191*lb*1 and a lower unit electrode 191*lb*2 which have a quadrangular shape overall, neighbor with a gap 95 interposed therebetween, and have the substantially same size. The upper unit electrode 191*lb*1 and the lower unit electrode 191*lb*2 are electrically connected to each other by at least one connection portion 196. However, while the lower unit electrode 191*la*2 of the first subpixel electrode 191*la* has a shape horizontally symmetrical to the shape of the upper unit electrode 191*la*1 in a reversed manner, the lower unit electrode 191*lb*2 of the second subpixel electrode 191*lb* has a shape substantially same or same as that of the upper unit electrode 191*lb*1.

The upper unit electrode 191*lb*1 includes a horizontal stem portion 195*a* and a vertical stem portion 197*a* connected to the horizontal stem portion 195*a* and defining a left edge of the upper unit electrode 191*lb* 1, and includes fine branch portions 194 slantingly extending outwardly from the horizontal stem portion 195*a* or the vertical stem portion 197*a*. The lower unit electrode 191*lb*2 includes a horizontal stem portion 195*b* and a vertical stem portion 197*b* connected to the horizontal stem portion 195*b* and defining a left edge of the upper unit electrode 191*lb*2, and includes fine branch portions 194 slantingly extending outwardly from the horizontal stem portion 195*b* or the vertical stem portion 197*b*. Thus, in both the upper unit electrode 191*lb*1 and the lower unit electrode 191*lb*2 of the second subpixel electrode 191*lb*, the vertical stem portions 197*a* and 197*b* are formed in the left edges. The vertical stem portions 197*a* and 197*b* may overlap with the second part 172*lb* of the reference voltage line 172*l*.

In a portion of the second subpixel region where the vertical stem portions 197*a* and 197*b* are positioned, liquid crystal molecules tilted in different directions may collide to weaken control force over the liquid crystal molecules, lowering transmittance, and the vertical stem portions 197*a* and 197*b* may be formed to overlap with a metal layer, such that the reference voltage line 172*l*, making it difficult for light to transmit therethrough. Thus, when light such as ultraviolet ray, or the like, is irradiated to form pretilting, light may not reach upper portions of the vertical step portions 197*a* and 197*b*, and thus, pretilting may not be formed on the vertical stem portions 197*a* and 197*b* of the lower substrate 100. In the pixel positioned in the left region of the display panel, if the vertical stem portions 197*a* and 197*b* are positioned in the right edge of the second subpixel electrode 191*lb* unlike the embodiment of the present disclosure, when a curved display panel is realized, the vertical stem portions 197*a* and 197*b* are shifted toward the center of the pixel region of the second subpixel, and thus, the lower display substrate 100 and the upper display substrate 200 are not aligned in the pretilt direction, resulting in that the portion where the vertical stem portions 197*a* and 197*b* are present appear to be relatively dark. However, as in the embodiment of the present invention, if the vertical stem portions 197*a* and 197*b* are positioned in the left edges of the second subpixel electrode 191*lb*, when a curved display panel is realized, the vertical stem portions 197*a* and 197*b* are shifted toward the boundary portion of the neighboring second subpixel region, namely, toward the non-transmission region in which a light blocking member, or the like, is formed to prevent light leakage on purpose, and thus, a degradation of luminance due to the vertical stem portions 197*a* and 197*b* can be reduced.

The foregoing mechanism may also be applied in the same manner to the second storage electrode line 131*lb* and the second part 172*lb* of the reference voltage line. The storage electrode line 131*l* and the reference voltage line 172*l* are formed of a metal making it difficult for light to transmit therethrough, and thus, when the storage electrode line 131*l* and the reference voltage line 172*l* are shifted toward the center of the second subpixel region, luminance may be degraded. In an embodiment of the present disclosure, the vertical portion of the second storage electrode line 131*lb* and the vertical portion of the second part 172*lb* of the reference voltage line are formed in a substantially left edge of the first subpixel region and are not formed in the vicinity of the right edge. Thus, since the vertical portion of the second storage electrode line 131*lb* and the vertical portion of the second part 172*lb* of the reference voltage line are shorted toward the boundary of the neighboring second subpixel region in the pixel positioned in the left region of the curved display panel, a degradation of luminance thereby may be reduced.

Various specific characteristics of the horizontal stem portions 195*a* and 195*b*, the vertical stem portions 197*a* and 197*b*, and the fine branch portions 194 of the second subpxiel electrode 191*lb* and contents of the plurality of subregions Da, Db, Dc, and Dd are the same as those of the first subpixel electrode 191*la* described above, and thus, additional descriptions thereof will be omitted.

A shielding electrode 273 may be formed on the second passivation layer 180*q* such that it overlaps with the data line 171 along the data line 171 positioned between the pixel electrodes 191*l* adjacent in the horizontal direction. In this case, when a voltage the same as a voltage applied to a common electrode 270 is applied to the shielding electrode 273, an electric field is not generated between the shielding electrode 273 and the common electrode 270. The liquid crystal molecules present therebetween are in a vertically aligned state, preventing light leakage between the pixel electrodes 191*l* and light reflection by the data line 171. The shielding electrode 273 may be formed of a material the same as that of the pixel electrode 191*l* and on the same layer as that of the pixel electrode 191*l* on the second passivation layer 180*q*.

Hereinafter, the upper display substrate 200 will be described.

A light blocking member 220 is formed on an insulating substrate 210 formed of transparent glass, plastic, or the like. The light blocking member 220 is also called a black matrix preventing light leakage and light reflection. The light blocking member 220 is formed to overlap with the gate line 121, the switching elements Qa, Qb, and Qc, and the like, in the direction in which the gate line 121 extends. The light blocking member 220 may also be formed to overlap with the data line 171 in the direction in which the data line extends, to have a lattice structure having an opening (namely, which does not cover the first and second subpixel electrodes 191*la* and 191*lb*) corresponding to the region (namely, the subpixel region) in which light is emitted to display an image. In a case in which the shielding electrode 273 is formed to overlap with the data line 171, the light blocking member 220 extending along the data line 171 may be omitted. The light blocking member 220 may be formed of a material not allowing light to be transmitted therethrough. According to an embodiment, the light blocking member 220 may be formed on the lower display substrate 100.

A color filter 230 is also formed on the substrate 210. In a case in which the second passivation layer 180*q* of the lower display substrate 100 is a color filter, the color filter 230 of the upper display substrate 200 may be omitted.

An overcoat 250 may be formed on the color filter 230 and the light blocking member 220 to prevent the color filter 230 from being exposed and provide a flat surface. The overcoat 250 may be omitted. A common electrode 270 is formed on the overcoat 250, and an alignment layer 21 may be formed on the common electrode 270.

The liquid crystal layer 3 positioned between the lower display substrate 100 and the upper display substrate 200 includes liquid crystal molecules 31. The liquid crystal molecules 31 may have negative dielectric anisotropy, and are aligned such that a longer axis thereof is perpendicular to surfaces of the two display substrates 100 and 200 in a state in which an electric field is not generated in the liquid crystal layer 3. The first subpixel electrode 191*la* and the second subpixel electrode 191*lb*, to which a data voltage is applied, generate an electric field together with the common electrode 270 of the upper display substrate 200, thereby determining orientation of the liquid crystal molecules 31 of the liquid crystal layer 3 between the two electrodes 191*l* and 270. Luminance of light passing through the liquid crystal layer 3 may vary depending on the determined orientation of the liquid crystal molecules 31.

Operations of the LCD device according to an embodiment of the present invention will be described with reference to FIGS. 2 through 6.

When a gate ON voltage is applied to the gate electrodes of the switching elements Qa and Qb to turn on the switching elements Qa and Qb, a data voltage is applied to the first subpixels 191*la* and the second subpixels 191*lb*. The subpixels 191*la* and 191*lb*, to which the data voltage has been applied, and the common electrode 270 to which a common voltage has been applied, generate together an electric field together in the liquid crystal layer 3.

The electric field includes a vertical component substantially perpendicular to the surfaces of the display substrates 100 and 200, and the liquid crystal molecules 31 tend to be tilted in a direction substantially parallel to the surfaces of the display substrates 100 and 200 by the vertical component of the electric field. A fringe field is formed between the edges of the fine branch portions 194 and the horizontal stem portions 195*a* and 195*b* and the vertical stem portions 197*a* and 197*b* of the first and second subpixel electrodes 191*la* and 191*lb* and the common electrode 270, and thus, the liquid crystal molecules 31 are substantially tilted toward the connection portions of the horizontal stem portions 195*a* and 195*b* and the vertical stem portions 197*a* and 197*b* and in a direction substantially parallel to a length direction of the fine branch portions 194. Thus, a plurality of domains with different tilt directions of the liquid crystal molecules 31 may be formed in the liquid crystal layer 3 in one pixel PX. In this manner, the liquid crystal layer 3 positioned in one pixel PX includes a plurality of domains in which directions in which the liquid crystal molecules 31 are tilted are different when an electric field is generated in the liquid crystal layer 3, thereby realizing a wide viewing angle. The directions in which the liquid crystal molecules 31 are tilted may be uniform in each domain, and the particular direction may be referred to as a behavior direction, and a behavior direction of the liquid crystal molecules 31 in each domain may be referred to simply as a domain direction.

In one pixel PX, domains of the liquid crystal layer 3 may correspond to a plurality of subregions Da to Dd of the first subpixel electrode 191*la* and the plurality of subregions Da to Dd of the second subpixel electrode 191*lb*, respectively. For example, in a case in which a pixel electrode includes eight subregions, namely, four subregions Da to Dd of the first subpixel electrode 191*la* and four subregions Da to Dd of the second subpixel electrode 191*lb*, the liquid crystal layer 3 corresponding thereto may have eight domains in each pixel PX.

For a fast response speed, the liquid crystal molecules 31 of each domain may be initially aligned at a pretilt angle in each behavior direction in a state in which an electrical field is not present in the liquid crystal layer 3. In this manner, in order to allow the liquid crystal molecules 31 to have a pretilt angle at an initial stage, an alignment layer having several orientation directions may be used, or the liquid crystal layer 3 or the alignment layer may include an alignment assistant for pretilting of the liquid crystal molecules 31. For pretilting of the liquid crystal molecules 31, light (such as ultraviolet rays) may be slantingly irradiated (on the alignment layers) to control an initial orientation direction and an orientation angle of the liquid crystal molecules 31. In one pixel, directions in which liquid crystal molecules 31 are tilted are different in each domain, and thus, pretilt directions are also different in each domain.

Hereinafter, a pixel position in the right region of the display panel will be described with reference to FIGS. 7 through 9.

FIG. 7 is a layout view of pixels positioned in a right region of the LCD device according to an embodiment of the present invention, FIG. 8 is a view illustrating a data line and a reference voltage line in the LCD device of FIG. 7, and FIG. 9 is a view illustrating a pixel electrode and a shielding electrode in the LCD device of FIG. 7.

The pixel positioned in the right region of the display panel is different from the pixel positioned in the left region of the display panel described above, in the shapes of the storage electrode line 131r, the reference voltage line 172r, and the pixel electrode 191r, and the other components thereof are the same. Thus, the differences will be largely described, and descriptions of the same components will be omitted or may be briefly made.

Referring to FIGS. 7 through 9, a gate conductor including a gate line 121 and a storage electrode line 131r is formed on an insulating substrate 110, and a pixel region is divided into an upper first subpixel region and a lower second subpixel region with respect to the gate line 121.

The storage electrode line 131r includes a first storage electrode line 131ra positioned above the gate line 121 and a second storage electrode line 131rb positioned below the gate line 121.

Like the first storage electrode 131ra present in the left region of the display panel, the first storage electrode line 131ra may have a shape similar to a number 8 displayed by a seven-segment display. However, the second storage electrode line 131rb is formed to surround three edges, excluding a left edge, of the second subpixel region. For example, the second storage electrode line 131rb may include three horizontal portions parallel to each other and one vertical portion connecting right end portions of the three horizontal portions, and may have a shape similar to a mirror image of a capitalized letter E displayed by a seven-segment display. Thus, the second storage electrode line 131rb present in the right region of the display panel may be symmetrical to the second storage electrode line 131rb having a shape of a capitalized letter E displayed by a seven-segment display in the left region, with respect to the central axis of the display panel.

A gate insulating layer 140, semiconductors 154a, 154b, and 154c, and resistive contact members 163a, 165a, 163b, 165b, 163c, and 165c are formed on the gate conductor, and a data conductor including a data line 171 and a reference voltage line 172r is formed on the resistive contact members 163a, 165a, 163b, 165b, 163c, and 165c and a gate insulating layer 140.

Referring to FIG. 8, the reference voltage line 172r includes a first part 172ra positioned in the first subpixel region above the gate line 121, a second part 172rb positioned in the second subpixel region below the gate line 121, and a third part 172rc connecting the first and second parts 172ra and 172rb.

Like the first part 172la of the reference voltage line 172l in the left region, the first part 172ra of the reference voltage line 172r may have a shape similar to a number 5 displayed by a seven-segment display without the bottom segment. The second part 172rb of the reference voltage line 172r may include, for example, two horizontal portions parallel to each other and one vertical portion, and here, the vertical portion connects right end portions of the two horizontal portions, forming a shape similar to a mirror image of a capitalized letter C displayed by a seven-segment display. Thus, the second portion 172rb present in the right region of the display panel may be symmetrical to the second portion 172lb having a shape similar to a capitalized letter C displayed by a seven-segment display in the left region with respect to the central axis of the display panel. The two horizontal portions may be positioned substantially in an upper edge of the second subpixel region and a lower edge of the second subpixel region, respectively, and the vertical portion may be positioned substantially in a right edge of the second subpixel region. According to an embodiment, the second part 172rb may further include a horizontal portion positioned in a substantially central portion between the upper edge and the lower edge of the second subpixel region, and the vertical portion may connect right end portions of the three horizontal portions to form a shape similar to a mirror shape of a capitalized letter E displayed by a seven-segment display. The third part 172rc of the reference voltage line 172r connects a lower end portion of the right vertical portion of the first part 172ra to a right end portion of the upper horizontal portion of the second part 172rb and an upper end portion of the vertical portion, and a portion of the third part 172rc may be branched to become a third drain electrode 175c.

A first passivation layer 180p and a second passivation layer 180q are formed on exposed portions of the data conductor and the semiconductors 154a, 154b, and 154c, on which a pixel electrode 191r including first and second subpixels 191ra and 191rb are formed.

Referring to FIG. 9, the first subpixel electrode 191ra includes an upper unit electrode 191ra1 and a lower unit electrode 191ra2 neighboring with a gap 95 interposed therebetween and connected through at least one connection portion 196. The upper unit electrode 191ra1 includes a vertical stem portion 197a defining one edge, for example, a left edge, a horizontal stem portion 195a extending from the substantially center of the vertical stem portion 197a in a horizontal direction, and fine branch portions 194 slantingly extending outwardly from the horizontal stem portion 195a or the vertical stem portion 197a. The lower unit electrode 191ra2 has a shape substantially horizontally symmetrical to the shape of the upper unit electrode 191ra1 in a reversed manner, and includes a vertical stem portion 197b defining one edge, for example, a right edge, a horizontal stem portion 195b extending from the substantially center of the vertical stem portion 197b in a horizontal direction, and fine branch portions 194 slantingly extending outwardly from the horizontal stem portion 195b or the vertical stem portion 197b. Thus, the first subpixel electrode 191ra may be formed to be the same as that present in the left region of the display panel.

Similar to the first subpixel electrode 191ra, a second subpixel electrode 191rb includes an upper unit electrode 191rb1 and a lower unit electrode 191rb2 neighboring with a gap 95 interposed therebetween and connected through at least one connection portion 196. However, while the upper unit electrode 191ra1 of the first subpixel electrode 191ra has a shape horizontally symmetrical to the shape of the lower unit electrode 191ra2 in a reversed manner, the upper unit electrode 191rb1 of the second subpixel electrode 191rb has a shape substantially same or same as that of the lower unit electrode 191rb2. Thus, the second subpixel electrode 191rb present in the right region of the display panel may be symmetrical to that of the left region of the display panel with respect to the central axis of the display panel.

In detail, the upper unit electrode 191rb1 of the second subpixel electrode 191rb includes a horizontal stem portion 195a and a vertical stem portion 197a connected to the horizontal stem portion 195a and defining a right edge of the upper unit electrode 191rb1, and includes fine branch portions 194 slantingly extending outwardly from the horizontal stem portion 195a or the vertical stem portion 197a. The lower unit electrode 191rb2 includes a horizontal stem portion 195b and a vertical stem portion 197b connected to the horizontal stem portion 195b and defining a right edge of the upper unit electrode 191rb2, and includes fine branch portions 194 slantingly extending outwardly from the horizontal stem portion 195b or the vertical stem portion 197b.

Thus, in both the upper unit electrode 191rb1 and the lower unit electrode 191rb2 of the second subpixel electrode 191rb, the vertical stem portions 197a and 197b are formed in the right edges.

If the vertical stem portions 197a and 197b that may appear to be relatively dark in the pixel positioned in the right region of the display panel are positioned in the left edges of the second subpixel electrode 191rb unlike the embodiment of the present invention, when a curved display panel is realized, the vertical stem portions 197a and 197b may be shifted toward the center of the pixel region of the second subpixel, and thus, luminance is degraded. However, as in the embodiment of the present invention, if the vertical stem portions 197a and 197b are positioned in the left edges of the second subpixel electrode 191rb, when a curved display panel is realized, the vertical stem portions 197a and 197b are shifted toward the non-transmission region in which a light blocking member, or the like, is formed to prevent light leakage on purpose, corresponding to the boundary portion of the neighboring second subpixel region, and thus, a degradation of luminance due to the vertical stem portions 197a and 197b can be reduced. The foregoing mechanism may also be applied in the same manner to the second storage electrode line 131rb and the second part 172rb of the reference voltage line as described above in relation to the pixel positioned in the left region of the display panel.

Thus, according to an embodiment of the present invention, by designing the vertical stem portions 197a and 197b, and the like, of the second subpixel electrodes 191lb and 191rb to be symmetrical in consideration of the fact that relative shifting of the lower display substrate 100 and the upper display substrates 200 appear to be different in the left region and the right region of the curved display panel, degradation of luminance in the curved display panel may be minimized.

Referring to FIG. 1, FIG. 2, FIG. 3, FIG. 4, FIG. 5, FIG. 6, FIG. 7, FIG. 8, and FIG. 9, the display device (e.g., the LCD device) may include a first data line (e.g., analogous to a data line 171 illustrated in FIG. 3), which may be configured to transmit a first data voltage. The display device may further include a first transistor (e.g., analogous to a transistor Qb illustrated in FIG. 2), which may be electrically connected to the first data line. The display device may further include a second data line (e.g., analogous to a data line 171 illustrated in FIG. 7), which may be configured to transmit a second data voltage and may extend parallel to the first data line. The display device may further include a second transistor (e.g., analogous to a transistor Qb illustrated in FIG. 2), which may be electrically connected to the second data line. The display device may further include a first subpixel electrode (e.g., analogous to the subpixel electrode 191lb illustrated in FIG. 3 and FIG. 5), which may be positioned at a first half (e.g., left region) of the display device, may be electrically connected to the first transistor, and may be configured to receive the first data voltage through the first transistor. The display device may further include a second subpixel electrode (e.g., analogous to the subpixel electrode 191rb illustrated in FIG. 7 and FIG. 9), which may be positioned at a second half (e.g., right region) of the display device, may be electrically connected to the second transistor, and may be configured to receive the second data voltage through the second transistor. A distance between a center of the display device (e.g., the boundary between the left region and the right region illustrated in FIG. 1) and a structure of the first subpixel electrode may be equal to a distance between the center of the display device and a structure of the second subpixel electrode. The structure of the first subpixel may be a mirror image of the structure of the second subpixel electrode in a layout view of the display device.

The first subpixel electrode may include a first member (e.g., a vertical member) and a second member (e.g., a horizontal member). The first member may extend parallel to the first data line. The second member may be directly connected to the first member and may extend perpendicular to the first member in a layout view of the display device. The second subpixel electrode may include a third member (e.g., a vertical member) and a fourth member (e.g., a horizontal member). The third member may extend parallel to the second data line. The fourth member may be directly connected to the third member and may extend perpendicular to the third member in the layout view of the display device. Referring to FIG. 1, FIG. 3, FIG. 5, FIG. 7, and FIG. 9, the second member and the fourth member may be aligned in a direction perpendicular to the first data line and may be positioned between the first member and the third member in the layout view of the display device.

The display device may include a gate line (e.g., analogous to the gate line 121 illustrated in FIG. 2), which may be electrically connected to the first transistor and may be formed of a conductive material. The display device may further include a first storage electrode line (e.g., analogous to the storage electrode line 131lb illustrated in FIG. 3), which may be formed of the conductive material and may overlap the first subpixel electrode. The display device may further include a second storage electrode line (e.g., analogous to the storage electrode line 131rb illustrated in FIG. 7), which may be formed of the conductive material and may overlap the second subpixel electrode. A distance between the center of the display device and a structure of the first storage electrode line may be equal to a distance between the center of the display device and a structure of the second storage electrode line. The structure of the first storage electrode line may be a mirror image of the structure of the second storage electrode line in the layout view of the display device.

The first storage electrode line may include a first part (e.g., a vertical part) and a second part (e.g., a horizontal part). The first part may extend parallel to the first data line. The second part may be directly connected to the first part and may extend perpendicular to the first part. The second storage electrode line may include a third part (e.g., a vertical part) and a fourth part (e.g., a horizontal part). The third part may extend parallel to the second data line. The fourth part may be directly connected to the third part and may extend perpendicular to the third part. The second part and the fourth part may be positioned between the first part and the third part in the direction perpendicular to the first data line in the layout view of the display device.

The display device may include an insulating layer (e.g., the insulating layer 140 or the passivation layer 180p illustrated in FIG. 6), which may directly contact the first data line. The display device may further include a first reference voltage line (e.g., the reference voltage line part 172lb illustrated in FIG. 3 and FIG. 4), which may directly contact the insulating layer and may overlap the first subpixel electrode. The display device may further include a second reference voltage line (e.g., the reference voltage line part 172rb illustrated in FIG. 7 and FIG. 8), which may directly contact the insulating layer and may overlap the second subpixel electrode. A distance between the center of the display device and a structure of the first reference voltage line may be equal to a distance between the center of the display device and a structure of the second reference voltage line. The structure of the first reference voltage line may be a mirror image of the structure of the second reference voltage line in the layout view of the display device.

The first reference voltage line may include a first portion (e.g., a vertical portion) and a first plurality of parallel portions (e.g., a plurality of horizontal portions). The first portion may extend parallel to the first data line. The first plurality of parallel portions may be directly connected to the first portion and may extend perpendicular to the first portion. The second reference voltage line may include a second portion (e.g., a vertical portion) and a second plurality of parallel portions (e.g., a plurality of horizontal portions). The second portion may extend parallel to the second data line. The second plurality of parallel portions may be directly connected to the second portion and may extend perpendicular to the second portion. The first plurality of parallel portions and the second plurality of parallel portions may be positioned between the first portion and the second portion in a layout view of the display device.

The first reference voltage line may include a first portion (e.g., vertical portion) and a second portion (e.g., a horizontal portion). The first portion may extend parallel to the first data line. The second portion may be directly connected to the first portion and may extend perpendicular to the first portion. The second reference voltage line may include a third portion (e.g., vertical portion) and a fourth portion (e.g., a horizontal portion). The third portion may extend parallel to the second data line. The fourth portion may be directly connected to the third portion and may extend perpendicular to the third portion. The second portion and the fourth portion may be positioned between the first portion and the third portion in the direction perpendicular to the first data line in the layout view of the display device.

The display device may include a third transistor. The display device may further include a fourth transistor. The display device may further include a third subpixel electrode, which may be electrically connected to the third transistor and may include a fifth member and a sixth member. The fifth member may extend parallel to the first data line and may be aligned with the first member in a direction parallel to the first data line. The sixth member may be directly connected to the fifth member and may extend perpendicular to the fifth member in a layout view of the display device. The display device may further include a fourth subpixel electrode, which may be electrically connected to the fourth transistor and may include a seventh member and an eighth member. The seventh member may extend parallel to the second data line portion and may be aligned with the third member in a direction parallel to the second data line. The eighth member may be directly connected to the seventh member and may extend perpendicular to the seventh member in the layout view of the display device. The sixth member and the eighth member may be positioned between the fifth member and the seventh member in the layout view of the display device, wherein both the first transistor and the third transistor may be electrically connected to a first gate line, and wherein both the second transistor and the fourth transistor may be electrically connected to the first gate line or a second gate line.

The display device may include a third transistor (e.g., analogous to the transistor Qa illustrated in FIG. 2). The display device may include a fourth transistor (e.g., analogous to the transistor Qa illustrated in FIG. 2). The display device may further include a third subpixel electrode (e.g., analogous to the subpixel electrode 191*la* illustrated in FIG. 3 and FIG. 5), which may be electrically connected to the third transistor and may be aligned with the first subpixel electrode (e.g., analogous to the subpixel electrode 191*lb* illustrated in FIG. 3 and FIG. 5) in a direction parallel to the first data line. The display device may further include a fourth subpixel electrode (e.g., analogous to the subpixel electrode 191*ra* illustrated in FIG. 7 and FIG. 9), which may be electrically connected to the fourth transistor and may be aligned with the second subpixel electrode (e.g., analogous to the subpixel electrode 191*rb* illustrated in FIG. 7 and FIG. 9) in a direction parallel to the second data line. A distance between a center of the display device and a structure of the third subpixel electrode may be equal to a distance between the center of the display device and a structure of the fourth subpixel electrode. The structure of the third subpixel may be identical to the structure of the fourth subpixel electrode in the layout view of the display device, wherein both the first transistor and the third transistor may be electrically connected to a first gate line (e.g., analogous to the gate line 121 illustrated in FIG. 2), and wherein both the second transistor and the fourth transistor may be electrically connected to the first gate line (e.g., analogous to the gate line 121 illustrated in FIG. 2) or a second gate line (e.g., analogous to the gate line 121 illustrated in FIG. 2). The third subpixel electrode may include a fifth member (e.g., a vertical member) and a sixth member (e.g., a horizontal member). The fifth member may extend parallel to the first data line and may be aligned with the first member in a direction parallel to the first data line. The sixth member may be directly connected to the fifth member and may extend perpendicular to the fifth member. The fifth member may be shorter than the first member. The sixth member may be as long as the second member. A length of the first subpixel electrode in the direction parallel to the first data line may be larger than a length of the third subpixel electrode in the direction parallel to the first data line.

The first subpixel electrode (e.g., analogous to the subpixel electrode 191*lb* illustrated in FIG. 3 and FIG. 5) may include a stem member (e.g., a lower vertical member), a first branch, and a second branch. The stem member may extend parallel to the first data line, may be spaced from the first member (e.g., an upper vertical member), and may be aligned with the first member may be a direction parallel to the first data line. The first branch may be directly connected to the first member and may be slanted with respect to the first member. The second branch may be directly connected to both the first branch and the stem member and may be slanted with respect to the stem member.

The left region and the right region of the display panel and pixels positioned in the two regions have been described. In a substantially central region (e.g., the boundary between the two regions illustrated in FIG. 1) of the display panel, misalignment between the lower display substrate 100 and the upper display substrate 200 may be relatively small or may rarely appear. Thus, the display panel may be configured to include the left region, a central region, and the right region, and pixels positioned in the three regions may have different structures. Pixels positioned in the left region and the right region may be configured as described above in consideration of the misalignment between the lower display substrate 100 and the upper display substrate 200. Pixels positioned in the central region may be formed to be different from pixels of each of the left region and the left region, in order to enhance transmittance.

Figure 10:
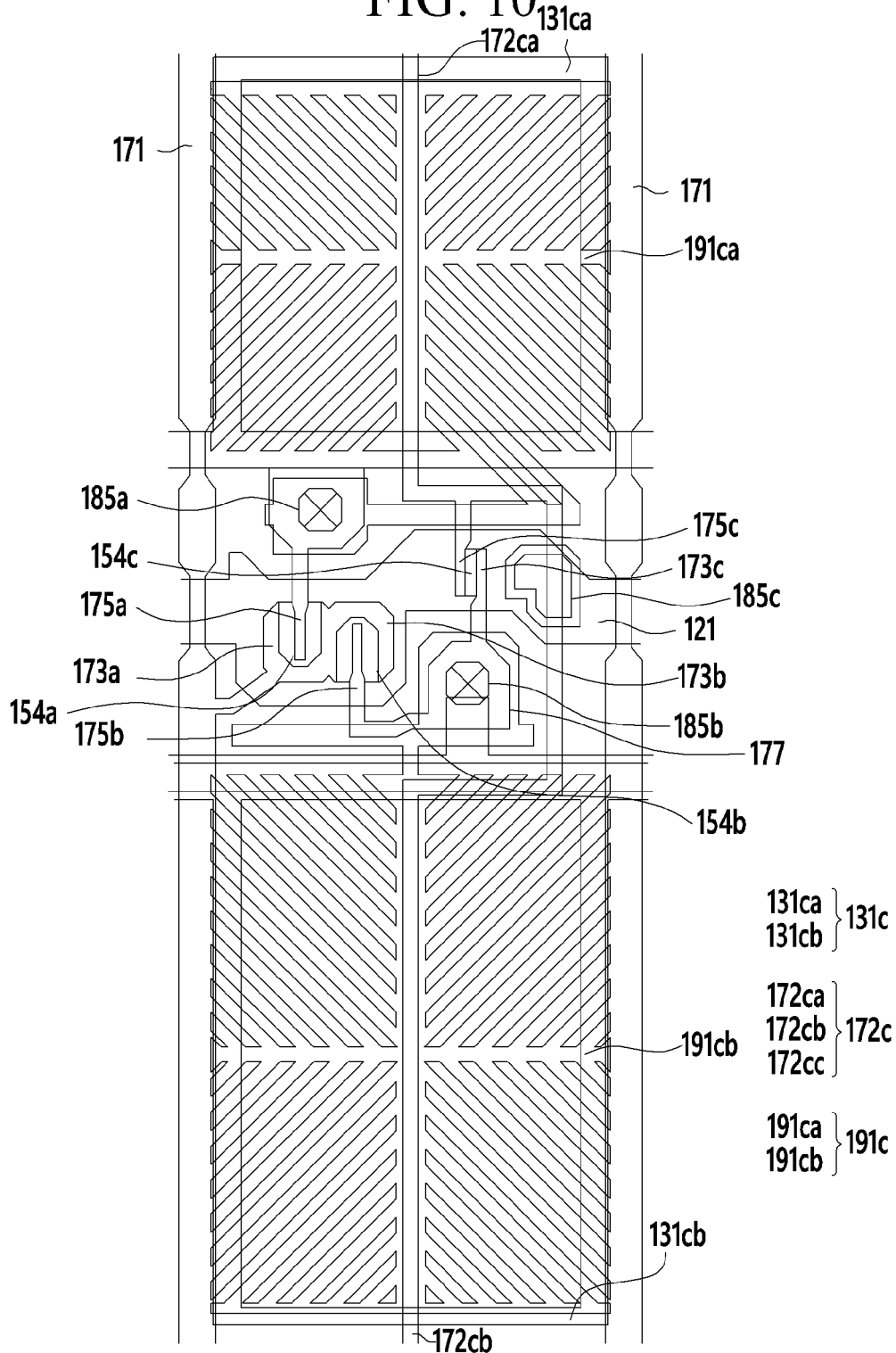
FIG. 10 is a schematic layout view illustrating a pixel of pixels positioned in a central region of the LCD device according to an embodiment of the present invention.
Figure 11:
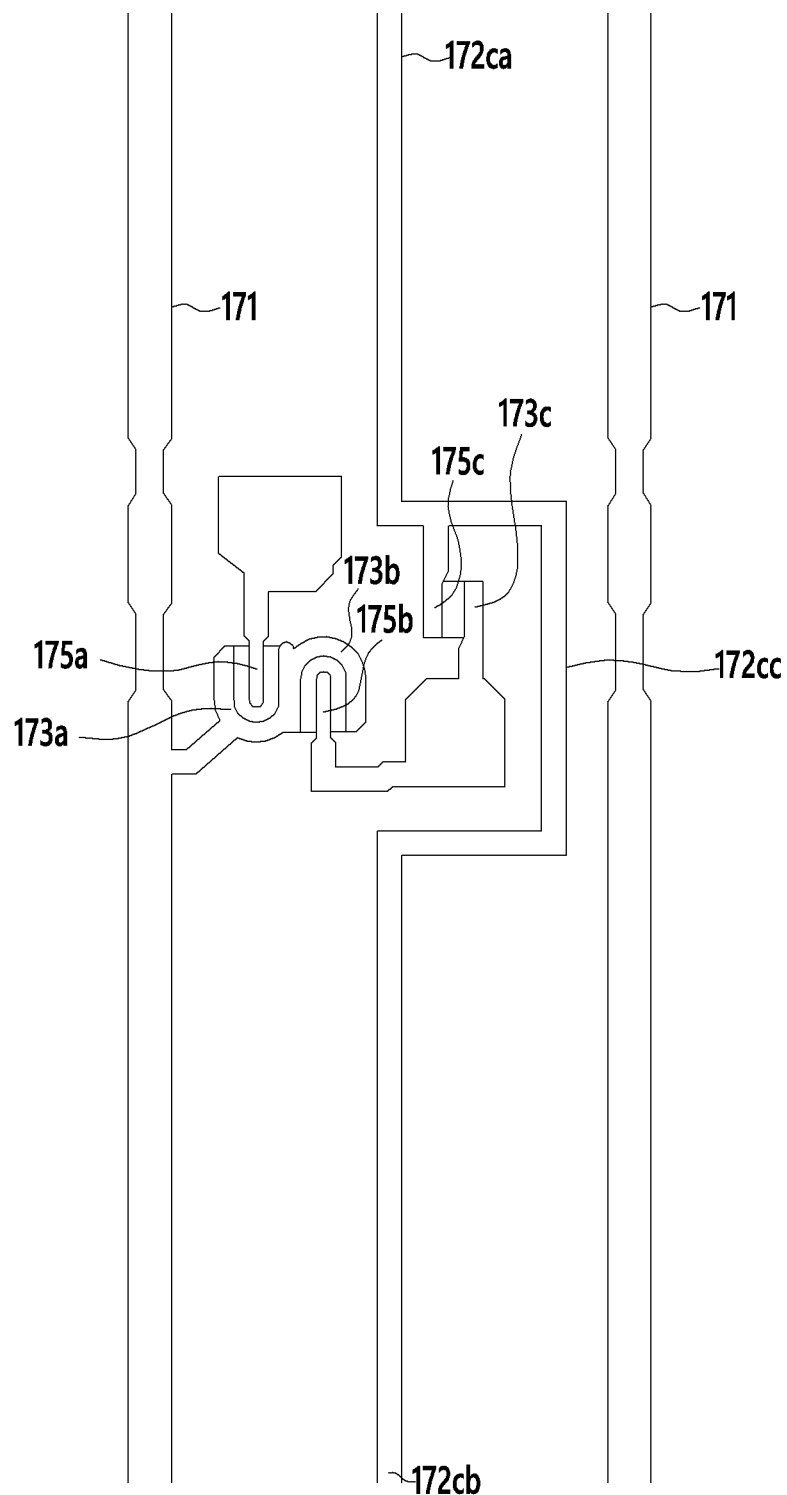
FIG. 11 is a schematic layout view illustrating a data line and a reference voltage line associated with the pixel illustrated in FIG. 10 according to an embodiment of the present invention.

FIG. 10 is a schematic layout view illustrating a pixel of pixels positioned in a central region of the LCD device (e.g., the boundary between the left region and the right region illustrated in FIG. 1) according to an embodiment of the present invention. FIG. 11 is a schematic layout view illustrating a data line and a reference voltage line associated with the pixel illustrated in FIG. 10. FIG. 12 is a schematic layout view illustrating a pixel electrode associated with the pixel illustrated in FIG. 10.

Referring to FIG. 10, a storage electrode line 131c may include a first storage electrode line 131ca positioned above the gate line 121 and a second storage electrode line 131cb positioned below the gate lines 121. The first storage electrode line 131ca may have a quadrangular shape surrounding four corners of the first subpixel region and the second storage electrode line 131cb may have a quadrangular shape surrounding four corners of the second subpixel region.

Referring to FIGS. 10 and 11, the reference voltage line 172c includes a first part 172ca, a second part 172cb, and a third part 172cc connecting the first part 172ca and the second part 172cb. The first part 172ca and the second part 172cb extend to traverse the center in a substantially vertical direction of the first pixel region and the second pixel region. The third part 172cc may connect a lower end portion of the first part 172ca and an upper end portion of the second part 172cb, and a portion of the third part 172cc may be branched to form a third drain electrode 175c.

Referring to FIGS. 10 and 12, the pixel electrode 191c includes a first subpixel electrode 191ca and a second subpixel electrode 191cb which have a substantially quadrangular shape overall. The first subpixel electrode 191c includes a cross stem portion including a horizontal stem portion 192 and a vertical stem portion 193 perpendicular to the horizontal stem portion 192. The vertical stem portion 193 overlaps with the first part 172ca of the reference voltage line 172c. The first subpixel electrode 191ca is divided into a first subregion Da, a seconds subregion Db, a third subregion Dc, and a fourth subregion Dd by the horizontal stem portion 192 and the vertical stem portion 193, and each of the subregions Da to Dd includes a plurality of first fine branch portions 194a, a plurality of second fine branch portions 194b, a plurality of third fine branch portions 194c, and a plurality of fourth fine branch portions 194d. The first to fourth fine branch portions 194a to 194d slantingly extend left upwardly, right upwardly, left downwardly, and right downwardly from the horizontal stem portion 192 or the vertical stem portion 193. Similar to the first subpixel electrode 191ca, the second subpixel electrode 191cb includes a horizontal stem portion 192, a vertical stem portion 193, and fine branch portions 194a to 194d, and is divided into first to fourth subregions Da to Dd. The vertical stem portion 193 overlaps with the second part 172cb of the reference voltage line 172c.

When an electric field is applied to the display panel, liquid crystal molecules are tilted substantially toward the cross stem portion and in a direction substantially parallel to a length direction of the fine branch portions 194a to 194d. Thus, in one pixel PX, domains of the liquid crystal layer 3 may correspond to the plurality of subregions Da to Dd of the first subpixel electrode 191ca and the plurality of subregions Da to Dd of the second subpixel electrode 191cb and may be eight.

When the pixel is formed in this manner, a region in which control force over liquid crystal molecules is weakened is reduced, compared with the pixel according to the previous embodiment, and thus, transmittance may increase. Also, the pixel may have visibility superior to that of the pixel according to the previous embodiment. However, when the lower display substrate 100 and the upper display substrate 200 are misaligned, pretilt directions between the two display substrates 100 and 200 may not be aligned particularly in the vicinity of the vertical stem portion 193 to generate texture, degrading transmittance.

Referring to FIG. 1, FIG. 2, FIG. 3, FIG. 4, FIG. 5, FIG. 6, FIG. 7, FIG. 8, FIG. 9, FIG. 10, FIG. 11, and FIG. 12, the display device may include a first subpixel electrode (e.g., analogous to the subpixel electrode 191lb illustrated in FIG. 3 and FIG. 5), which may be positioned in a first half of the display device (e.g., the left region of the display panel illustrated in FIG. 1). The display device may further include a second subpixel electrode (e.g., analogous to the subpixel electrode 191rb illustrated in FIG. 7 and FIG. 9), which may be positioned in a second half of the display device (e.g., the right region of the display panel illustrated in FIG. 1). The display device may further include a third subpixel electrode (e.g., analogous to the subpixel electrode 191cb illustrated in FIG. 10 and FIG. 12), which may be positioned between the first subpixel electrode and the second subpixel electrode in the layout view of the display device.

The first subpixel electrode may include a first member (e.g., a vertical member at the left) and a second member (e.g., a horizontal member). The first member may extend parallel to a first data line. The second member may be directly connected to the first member and may extend perpendicular to the first member in a layout view of the display device.

The second subpixel electrode may include a third member (e.g., a vertical member at the right) and a fourth member (e.g., a horizontal member). The third member may extend parallel to a second data line. The fourth member may be directly connected to the third member and may extend perpendicular to the third member in the layout view of the display device. The second member and the fourth member may be aligned in a direction perpendicular to the first data line and may be positioned between the first member and the third member in the layout view of the display device.

The third subpixel electrode may include a first stem (e.g., a vertical stem), a second stem (e.g., a horizontal stem at the left of the first stem), and a third stem (e.g., a horizontal stem at the right of the first stem). The first stem may be positioned between the second stem and the third stem in the layout view of the display device. The first stem may extend parallel to the first data line. Each of the second stem and the third stem may be directly connected to the first stem and may extend perpendicular to the first stem. The second stem may be positioned between the second member and the first stem in the layout view of the display device. The third stem may be positioned between the fourth member and the first stem in the layout view of the display device.

The display device may further include an insulating layer (e.g., the insulating layer 140 or the passivation layer 180p illustrated in FIG. 6), which may directly contact the first data line. The display device may further include a reference voltage line (e.g. the reference voltage line part 172cb illustrated in FIG. 11), which may directly contact the insulating layer. A portion of the reference voltage line may extend parallel to the first data line and may overlap the first stem.

Figure 13:
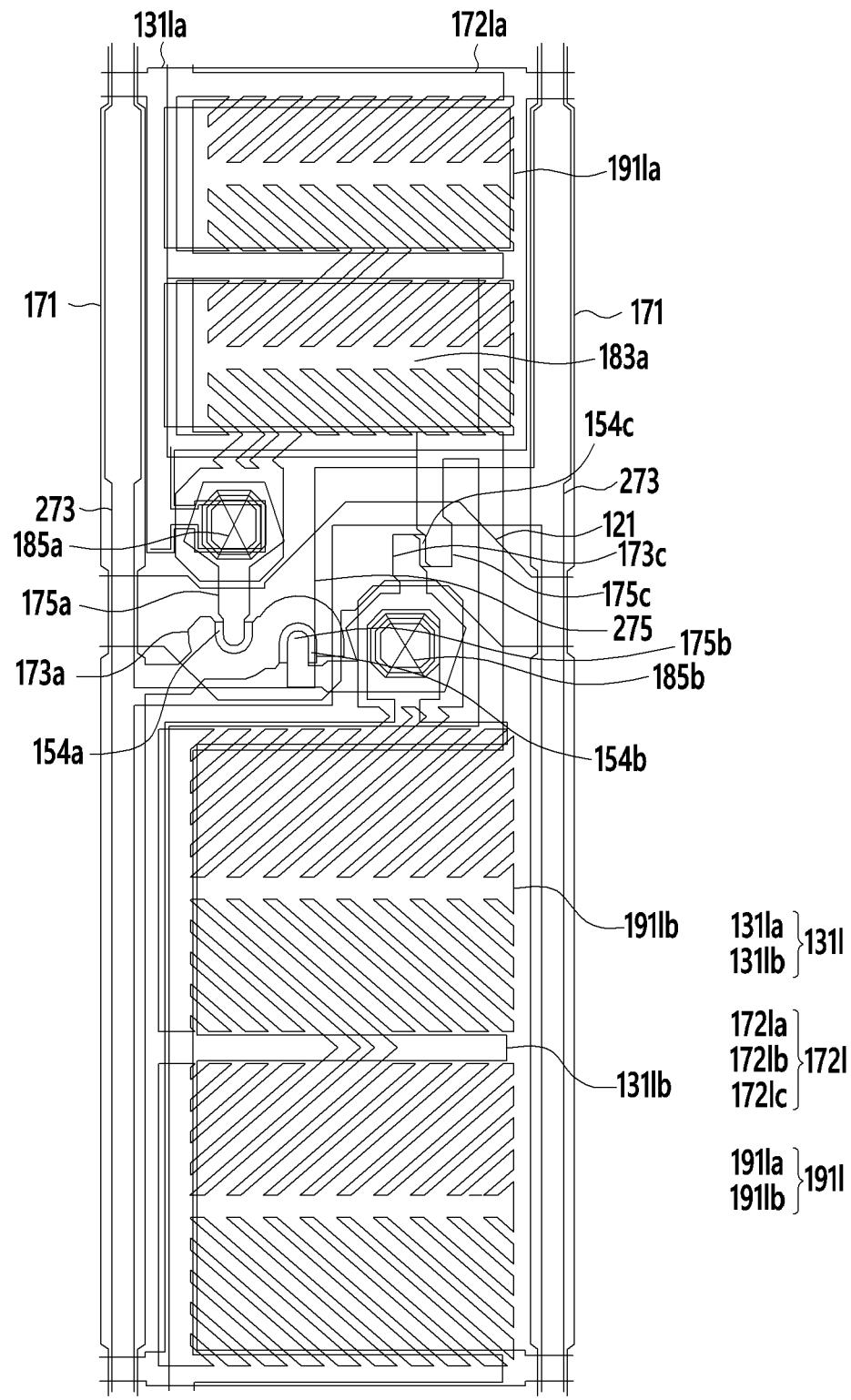
FIG. 13 is a schematic layout view illustrating a pixel of pixels positioned in a first half (e.g., a left region) of a display device according to an embodiment of the present invention.
Figure 14:
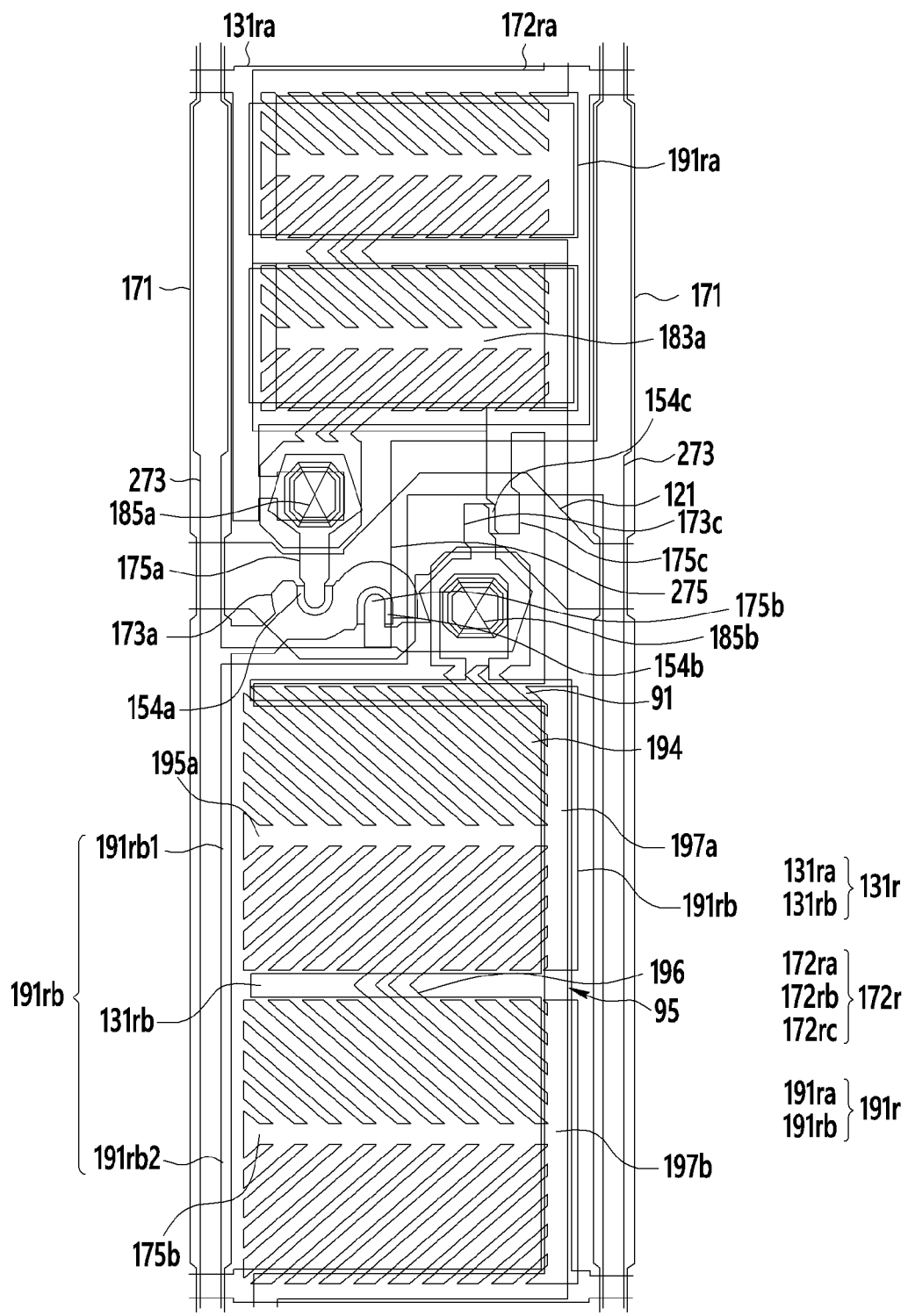
FIG. 14 is a schematic layout view illustrating a pixel of pixels positioned in a second half (e.g., a right region) of the display device according to an embodiment of the present invention.

FIG. 13 is a schematic layout view illustrating a pixel of pixels positioned in a first half (e.g., a left region) of a display device according to an embodiment of the present invention. FIG. 14 is a schematic layout view illustrating a pixel of pixels positioned in a second half (e.g., a right region) of the display device according to an embodiment of the present invention.

The display device may have features analogous to features described above with reference to FIGS. 3 through 12. Nevertheless, structures of the first part 172*la* of the reference voltage line 172*l* positioned in the first subpixel region and the first subpixel electrode 191*la* in the pixel illustrated in FIG. 13 may be substantially different from structures of the first part 172*ra* of the reference voltage line 172*r* positioned in the first subpixel region and the first subpixel electrode 191*ra* in the pixel illustrated in FIG. 14.

Referring to FIG. 13 illustrating a pixel positioned in the left region of the display panel, the first part 172*la* of the reference voltage line 172*l* may include, for example, three horizontal portions parallel to each other and a vertical portion connecting left end portions of the three horizontal portions, forming a shape similar to a capitalized letter E displayed by a seven-segment display. The three horizontal portions may be positioned in a substantially upper edge of the first subpixel region, a substantially lower edge of the first subpixel region, and a substantially central region between the upper edge and the lower edge, and the vertical portion may be positioned in a substantially left edge of the first subpixel region. According to an embodiment, the first part 172*la* may have a shape similar to a capitalized letter C displayed by a seven-segment display, without having a horizontal portion positioned in a substantially central portion between the upper edge and the lower edge. The second part 172*lb* of the reference voltage line 172*l* may be the same as the second part 172*lb* described above with reference to FIG. 4.

In the pixel positioned in the left region of the display panel, the first subpixel electrode 191*la* includes an upper unit electrode 191*la*1 and a lower unit electrode 191*la*2 which have a quadrangular shape overall, neighbor with a gap 95 interposed therebewteen, and have the substantially same size. The upper unit electrode 191*la*1 and the lower unit electrode 191*la* 2 are electrically connected to each other by at least one connection portion 196. The upper unit electrode 191*la* 1 of the first subpixel electrode 191*la* has a shape substantially the same or the same as that of the lower unit electrode 191*la*2. That is, the upper unit electrode 191*la*1 includes a horizontal stem portion 195*a* and a vertical stem portion 197*a* connected to the horizontal stem portion 195*a* and defining a left edge of the upper unit electrode 191*la*1, and includes fine branch portions 194 slantingly extending outwardly from the horizontal stem portion 195*a* or the vertical stem portion 197*a*. The lower unit electrode 191*la*2 includes a horizontal stem portion 195*b* and a vertical stem portion 197*b* connected to the horizontal stem portion 195*b* and defining a left edge of the lower unit electrode 191*la*2, and includes fine branch portions 194 slantingly extending outwardly from the horizontal stem portion 195*b* or the vertical stem portion 197*b*. Thus, in both the upper unit electrode 191*la*1 and the lower unit electrode 191*la*2 of the first subpixel electrode 191*la*, the vertical stem portions 197*a* and 197*b* are formed in the left edges. The second subpixel electrode 191*lb* may be the same as the second subpixel electrode described above with reference to FIG. 5.

Referring to FIG. 14, in the case of the pixel positioned in the right region of the display panel, the first part of the reference voltage 172*r* and the first subpixel electrode 191*ra* are formed to be symmetrical to those illustrated in FIG. 13 with respect to the central axis of the display panel That is, the first part 172*ra* of the reference voltage line 172*r* has a shape similar to a mirror shape of a capitalized letter E displayed by a seven-segment display, and may have a shape similar to a mirror image of a shape of a capitalized letter C displayed by a seven-segment display according to an embodiment. The upper and lower unit electrodes 191*ra*1 and 191*ra*2 of the first subpixel electrode 191*ra* include horizontal stem portions 195*a* and 195*b* and vertical stem portions 197*a* and 197*b* connected to the horizontal stem portions 195*a* and 195*b* and defining left edges of the upper and lower unit electrodes 191*ra*1 and 191*ra*2, and include fine branch portions 194 slantingly extending outwardly from the horizontal stem portions 195*a* and 195*b* and the vertical stem portions 197*a* and 197*b*. Thus, in both the upper and lower unit electrodes 191*ra*1 and 191*a* 2, the vertical stem portions 197*a* and 197*b* are formed on the left edges. The second part 172*rb* of the reference voltage line 172*r* and the second subpixel electrode 191*rb* may be the same as those described above with reference to FIGS. 8 and 9, and may be symmetrical to those illustrated in FIG. 7 with respect to the central axis of the display panel.

In this manner, since the first subpixel electrodes 191*la* and 191*ra* positioned in the first subpixel region and the first parts 172*la* and 172*ra* of the reference voltage lines 172*l* and 172*r* are designed to be symmetrical in the left region and the right region of the display panel like the second subpixel electrodes 191*lb* and 191*rb* positioned in the second subpixel region and the second parts 172*lb* and 171*rb* of the reference voltage lines 172*l* and 172*r*, a degradation rate of luminance generated in the curved display panel can be minimized. However, the first subpixel region is a region generally smaller than the second subpixel region and a region to which a high voltage is applied to display a high gray level. Thus, a degradation of transmittance or an improvement of transmittance due to the vertical stem portions 197*a* and 197*b* of the subpixel electrode may appear to be smaller than that of the second subpixel region.

Referring to FIG. 1, FIG. 2, FIG. 3, FIG. 4, FIG. 5, FIG. 6, FIG. 7, FIG. 8, FIG. 9, FIG. 10, FIG. 11, and FIG. 12, the display device may include a first data line (e.g., analogous to a data line 171 illustrated in FIG. 13), which may be configured to transmit a first data voltage. The display device may further include a first transistor (e.g., analogous to a transistor Qb illustrated in FIG. 2), which may be electrically connected to the first data line. The display device may further include a second data line (e.g., analogous to a data line 171 illustrated in FIG. 14), which may be configured to transmit a second data voltage and may extend parallel to the first data line. The display device may further include a second transistor (e.g., analogous to a transistor Qb illustrated in FIG. 2), which may be electrically connected to the second data line. The display device may further include a first subpixel electrode (e.g., analogous to the subpixel electrode 191*lb* illustrated in FIG. 13), which may be positioned at a first half (e.g., left region) of the display device, may be electrically connected to the first transistor, and may be configured to receive the first data voltage through the first transistor. The display device may further include a second subpixel electrode (e.g., analogous to the subpixel electrode 191*rb* illustrated in FIG. 14), which may be positioned at a second half (e.g., right region) of the display device, may be electrically connected to the second transistor, and may be configured to receive the second data voltage through the second transistor. A distance between a center of the display device (e.g., the boundary between the left region and the right region illustrated in FIG. 1) and a structure of the first subpixel electrode may be equal to a distance between the center of the display device and a structure of the second subpixel electrode. The structure of the first subpixel may be a mirror image of the structure of the second subpixel electrode in a layout view of the display device.

The display device may include a third transistor (e.g., analogous to a transistor Qa illustrated in FIG. 2). The display device may further include a fourth transistor (e.g., analogous to a transistor Qa illustrated in FIG. 2). The display device may further include a third subpixel electrode (e.g., analogous to the subpixel electrode 191la illustrated in FIG. 13), which may be electrically connected to the third transistor and may be aligned with the first subpixel electrode in a direction parallel to the first data line. The display device may further include a fourth subpixel electrode (e.g., analogous to the subpixel electrode 191ra illustrated in FIG. 14), which may be electrically connected to the fourth transistor and may be aligned with the second subpixel electrode in a direction parallel to the second data line. A distance between a center of the display device and a structure of the third subpixel electrode may be equal to a distance between the center of the display device and a structure of the fourth subpixel electrode. The structure of the third subpixel may be a mirror image of the structure of the fourth subpixel electrode in the layout view of the display device, wherein both the first transistor and the third transistor may be electrically connected to a first gate line (e.g., analogous to the gate line 121 illustrated in FIG. 2), and wherein both the second transistor and the fourth transistor may be electrically connected to the first gate line or a second gate line (e.g., analogous to the gate line 121 illustrated in FIG. 2).

According to embodiments of the present invention, structures of subpixel electrodes, storage electrode lines, and/or reference voltage lines positioned at a first half (e.g., left half) of a display device may substantially mirror structures of structures of subpixel electrodes, storage electrode lines, and/or reference voltage lines positioned at a second half (e.g., right half) of the display device. The mirrored configuration may correspond to the different (e.g., substantially mirrored) upper-lower substrate misalignment directions in the first half (e.g., left half) of the display device and the second half (e.g., right half) of the display device. As a result, undesirable texture displayed in images may be substantially minimized, and/or luminance of displayed images may be substantially maximized. Advantageously, the display device may display images with satisfactory quality.

While embodiments of this invention have been described, the invention is not limited to the described embodiments. This invention is intended to cover various modifications and equivalent arrangements included within the spirit and scope defined by the appended claims.

What is claimed is:

1. A display device comprising:
   a first data line;
   a first transistor, which is electrically connected to the first data line;
   a second data line;
   a second transistor, which is electrically connected to the second data line;
   a first subpixel electrode, which is positioned at a first half of the display device, is electrically connected to the first transistor, and comprises a first member and a second member, wherein the first member extends parallel to the first data line and is positioned closest among all portions of the first subpixel electrode relative to the first data line, and wherein the second member is directly connected to the first member and extends perpendicular to the first member in a layout view of the display device, an end of the second member directly connecting to no portion of the first subpixel electrode in a direction parallel to the first data line and being positioned farthest among the all portions of the first subpixel electrode relative to the first data line; and
   a second subpixel electrode, which is positioned at a second half of the display device, is electrically connected to the second transistor, and comprises a third member and a fourth member, wherein the third member extends parallel to the second data line and is positioned farthest among all portions of the second subpixel electrode relative to the second data line, wherein the fourth member is directly connected to the third member and extends perpendicular to the third member in the layout view of the display device, an end of the fourth member directly connecting to no portion of the second subpixel electrode in a direction parallel to the second data line and being positioned closest among the all portions of the second subpixel electrode relative to the second data line, and wherein the second member and the fourth member are positioned between the first member and the third member in the layout view of the display device.

2. The display device of claim 1, wherein the second member and the fourth member are aligned in a direction perpendicular to the first data line in the layout view of the display device, and wherein a structure of the first member combined with the second member is a mirror image of a structure of the third member combined with the fourth member in the layout view of display device.

3. The display device of claim 1, further comprising:
   a gate line, which is electrically connected to the first transistor and is formed of a conductive material;
   a first storage electrode line, which is formed of the conductive material, overlaps the first subpixel electrode, and comprises a first part and a second part, wherein the first part extends parallel to the first data line and is positioned closest among all portions of the first storage electrode line relative to the first data line, and wherein the second part is directly connected to the first part and extends perpendicular to the first part farthest among the all portions of the first storage electrode line relative to the first data line; and
   a second storage electrode line, which is formed of the conductive material, overlaps the second subpixel electrode, and comprises a third part and a fourth part, wherein the third part extends parallel to the second data line and is positioned farthest among all portions of the second storage electrode line relative to the second data line, wherein the fourth part is directly connected to the third part and extends perpendicular to the third part closest among the all portions of the second storage electrode line relative to the second data line, and wherein the second part and the fourth part are positioned between the first part and the third part in the direction perpendicular to the first data line in the layout view of the display device.

4. The display device of claim 3, wherein a structure of the first part combined with the second part is a mirror image of a structure of the third part combined with the fourth part in the layout view of the display device.

5. The display device of claim 1, further comprising:
   an insulating layer, which directly contacts the first data line;

a first reference voltage line, which directly contacts the insulating layer, overlaps the first subpixel electrode, and comprises a first portion and a second portion, wherein the first portion extends parallel to the first data line and is positioned closest among all portions of the first reference voltage line relative to the first data line, and wherein the second portion is directly connected to the first portion and extends perpendicular to the first portion farthest among the all portions of the first reference voltage line relative to the first data line; and a second reference voltage line, which directly contacts the insulating layer, overlaps the second subpixel electrode, and comprises a third portion and a fourth portion, wherein the third portion extends parallel to the second data line and is positioned farthest among all portions of the second voltage reference line relative to the second data line, wherein the fourth portion is directly connected to the third portion and extends perpendicular to the third portion closest among the all portions of the second reference voltage line relative to the second data line, and wherein the second portion and the fourth portion are positioned between the first portion and the third portion in the direction perpendicular to the first data line in the layout view of the display device.

6. The display device of claim 5, wherein a structure of the first combined with the second portion is a mirror image of structure of the third portion combined with the fourth portion in the layout view of the display device.

7. The display device of claim 5, wherein the first portion overlaps the first member.

8. The display device of claim 1, further comprising: a third subpixel electrode, which is positioned between the first subpixel electrode and the second subpixel electrode in the layout view of the display device and comprises a first stem, a second stem, and a third stem, wherein the first stem is positioned between the second stem and the third stem in the layout view of the display device, wherein the first stem extends parallel to the first data line, wherein each of the second stem and the third stem is directly connected to the first stem and extends perpendicular to the first stem, wherein the second stem is positioned between the second member and the first stem in the layout view of the display device, and wherein the third stem is positioned between the fourth member and the first stem in the layout view of the display device.

9. The display device of claim 8, further comprising:
an insulating layer, which directly contacts the first data line; and
a reference voltage line, which directly contacts the insulating layer, wherein a portion of the reference voltage line extends parallel to the first data line and overlaps the first stem.

10. The display device of claim 1, further comprising:
a third transistor;
a fourth transistor;
a third subpixel electrode, which is electrically connected to the third transistor and comprises a fifth member and a sixth member, wherein the fifth member extends parallel to the first data line and is aligned with the first member in a direction parallel to the first data line, and wherein the sixth member is directly connected to the fifth member and extends perpendicular to the fifth member in a layout view of the display device; and
a fourth subpixel electrode, which is electrically connected to the fourth transistor and comprises a seventh member and an eighth member, wherein the seventh member extends parallel to the second data line portion and is aligned with the third member in a direction parallel to the second data line, wherein the eighth member is directly connected to the seventh member and extends perpendicular to the seventh member in the layout view of the display device, wherein the sixth member and the eighth member are positioned between the fifth member and the seventh member in the layout view of the display device, wherein both the first transistor and the third transistor are electrically connected to a first gate line, and wherein both the second transistor and the fourth transistor are electrically connected to the first gate line or a second gate line.

11. The display device of claim 1, further comprising:
a third transistor;
a fourth transistor;
a third subpixel electrode, which is electrically connected to the third transistor and is aligned with the first subpixel electrode in a direction parallel to the first data line; and
a fourth subpixel electrode, which is electrically connected to the fourth transistor and is aligned with the second subpixel electrode in a direction parallel to the second data line, wherein the structure of the third subpixel electrode is a mirror image of the structure of the fourth subpixel electrode in the layout view of the display device, wherein both the first transistor and the third transistor are electrically connected to a first gate line, and wherein both the second transistor and the fourth transistor are electrically connected to the first gate line or a second gate line.

12. The display device of claim 1, further comprising:
a third transistor;
a fourth transistor;
a third subpixel electrode, which is electrically connected to the third transistor and is aligned with the first subpixel electrode in a direction parallel to the first data line; and
a fourth subpixel electrode, which is electrically connected to the fourth transistor and is aligned with the second subpixel electrode in a direction parallel to the second data line wherein a structure of the third subpixel is identical to a structure of the fourth subpixel electrode in the layout view of the display device, wherein both the first transistor and the third transistor are electrically connected to a first gate line, and wherein both the second transistor and the fourth transistor are electrically connected to the first gate line or a second gate line.

13. The display device of claim 12, wherein the third subpixel electrode comprises a fifth member and a sixth member, wherein the fifth member extends parallel to the first data line and is aligned with the first member in a direction parallel to the first data line, wherein the sixth member is directly connected to the fifth member and extends perpendicular to the fifth member, wherein the fifth member is shorter than the first member, and wherein the sixth member is as long as the second member.

14. The display device of claim 1, wherein the first subpixel electrode further comprises a stem member, a first branch, and a second branch, wherein the stem member extends parallel to the first data line, is spaced from the first member, and is aligned with the first member is a direction parallel to the first data line, wherein the first branch is directly connected to the first member and is slanted with respect to the first member, and wherein the second branch is directly connected to both the first branch and the stem member and is slanted with respect to the stem member.

15. The display device of claim 1, comprising a curved display panel, wherein the curved display panel comprises the first subpixel electrode and the second subpixel electrode.

* * * * *